United States Patent
Sugano et al.

(10) Patent No.: US 8,963,415 B2
(45) Date of Patent: Feb. 24, 2015

(54) ORGANIC EL ELEMENT, DISPLAY PANEL, AND DISPLAY DEVICE

(75) Inventors: Kou Sugano, Hyogo (JP); Ryuuta Yamada, Kyoto (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/821,327

(22) PCT Filed: Nov. 15, 2010

(86) PCT No.: PCT/JP2010/006704
§ 371 (c)(1),
(2), (4) Date: Mar. 7, 2013

(87) PCT Pub. No.: WO2012/066592
PCT Pub. Date: May 24, 2012

(65) Prior Publication Data
US 2013/0240854 A1    Sep. 19, 2013

(51) Int. Cl.
*H01L 51/10* (2006.01)
*H01L 51/52* (2006.01)

(52) U.S. Cl.
CPC ........ *H01L 51/5203* (2013.01); *H01L 51/5218* (2013.01); *H01L 2251/308* (2013.01); *H01L 2251/5315* (2013.01)
USPC .......................................... 313/504; 257/40

(58) Field of Classification Search
CPC ............ H01L 51/5206; H01L 51/5203; H01L 33/405
USPC ............................................ 257/40; 313/504
See application file for complete search history.

(56) References Cited

U.S. PATENT DOCUMENTS

| 5,443,922 | A | 8/1995 | Nishizaki et al. |
| 7,190,111 | B2 | 3/2007 | Lee et al. |
| 2002/0104995 | A1* | 8/2002 | Yamazaki et al. ............. 257/72 |
| 2003/0234608 | A1 | 12/2003 | Lee et al. |
| 2004/0021413 | A1* | 2/2004 | Ito et al. ..................... 313/504 |

(Continued)

FOREIGN PATENT DOCUMENTS

| JP | 05-163488 | 6/1993 |
| JP | 11-054286 | 2/1999 |

(Continued)

OTHER PUBLICATIONS

U.S. Appl. No. 13/812,569 to Masahiro Nakamura et al., filed Jan. 28, 2013.

(Continued)

*Primary Examiner* — Thomas L Dickey
(74) *Attorney, Agent, or Firm* — Greenblum & Bernstein, P.L.C.

(57) ABSTRACT

An organic EL element comprises: a transparent electrode; a reflective electrode opposite the transparent electrode; and a light-emitting layer having a film thickness of 20 nm to 200 nm, between the electrodes. The reflective electrode is a layered film of: a metal film including Al as a main component and having a film thickness of at least 43 nm; and a Ni film, whose film thickness d satisfies: 0 nm<d<5 nm, layered with respect to an entirety of a surface, facing the light-emitting layer, of the metal film, without interposition of an oxide layer that covers the surface of the metal film entirely. A surface of the layered film facing the light-emitting layer has an average roughness Ra satisfying: 0.6 nm≤Ra<2.0 nm and a maximum height difference Rmax satisfying: 5 nm≤Rmax<20 nm.

18 Claims, 21 Drawing Sheets

(56) References Cited

U.S. PATENT DOCUMENTS

| | | | |
|---|---|---|---|
| 2004/0164671 A1* | 8/2004 | Noguchi | 313/504 |
| 2005/0208330 A1* | 9/2005 | Raychaudhuri et al. | 428/690 |
| 2009/0001373 A1* | 1/2009 | Ochi et al. | 257/59 |
| 2009/0012374 A1* | 1/2009 | Schmelzeisen-Redeker et al. | 600/301 |
| 2009/0021539 A1* | 1/2009 | Kimura | 345/690 |
| 2009/0066223 A1* | 3/2009 | Yabe et al. | 313/504 |
| 2009/0066237 A1 | 3/2009 | Kambe et al. | |
| 2009/0212689 A1* | 8/2009 | Lee et al. | 313/504 |
| 2011/0248272 A1 | 10/2011 | Ochi et al. | |
| 2011/0291085 A1 | 12/2011 | Kondoh et al. | |

FOREIGN PATENT DOCUMENTS

| | | |
|---|---|---|
| JP | 2004-192890 | 7/2004 |
| JP | 2005-268099 | 9/2005 |
| JP | 2006-154494 | 6/2006 |
| JP | 2007-536717 | 12/2007 |
| JP | 2009-070640 | 4/2009 |
| JP | 2009-238759 | 10/2009 |
| JP | 2010-135300 | 6/2010 |
| WO | 2010/092798 | 8/2010 |

OTHER PUBLICATIONS

U.S. Appl. No. 13/812,571 to Masahiro Nakamura et al., filed Jan. 28, 2013.

U.S. Appl. No. 13/812,659 to Masahiro Nakamura et al., filed Jan. 28, 2013.

International Search Report (ISR) in International Application No. PCT/JP2010/006704, dated Jan. 11, 2011.

\* cited by examiner (a)

(b)

(c)

(a)

(b)

(c)

(a)

(b)

(c)

(a)

(b)

(c)

(a)

(b)

(c)

(a)

(e)

(b)

(f)

(c)

(g)

(d)

(h)

(a)

(b)

(a)

(b)

ORGANIC EL ELEMENT, DISPLAY PANEL, AND DISPLAY DEVICE

TECHNICAL FIELD

The present relates to an organic electroluminescence (EL) element, and a display panel including the organic EL element, and a display device including the organic EL element.

BACKGROUND ART

Recently, much research and development is in progress of technology for improving light-emitting efficiency of an organic EL element (for instance, refer to Patent Literatures 1 and 2). A typical organic EL element includes: a TFT substrate; an anode; a cathode; an interlayer insulating layer; a charge injection layer; a light-emitting layer; and an electron transport layer. The anode serves as a bottom electrode in the organic EL element, and is formed on the TFT substrate with the interlayer insulating layer therebetween. Above the anode, the charge injection layer, the light-emitting layer, the electron transport layer, and the cathode, which serves as a top electrode in the organic EL element, are formed in the stated order. More specifically, the light-emitting layer is formed within each one of a plurality of apertures defined by a bank provided to the organic EL element. Further, in the organic EL element, either the top electrode or the bottom electrode is a reflective electrode, and the other one of the top electrode and the bottom electrode is a transparent electrode. Light emitted from the light-emitting layer is reflected by the reflective electrode and is guided out from the organic EL element from the side of the transparent electrode.

In the case of a top-emission type organic EL element, light is to be guided out from the side of the top electrode. As such, in a top-emission type organic EL element, the top electrode is the transparent electrode, and the bottom electrode is the reflective electrode. More specifically, a light-emitting layer included in a top-emission type organic EL element emits light in two directions, towards a bottom electrode and towards a top electrode. The light emitted by the light-emitting layer towards the bottom electrode is reflected by the bottom electrode and is guided out from the side of the top electrode, or that is, from the side of the transparent electrode. A reflective electrode in an organic EL element is commonly formed by using a metal film having high optical reflectivity (hereafter also referred to simply as "reflectivity"). By using a metal film having high reflectivity, the efficiency with which light is reflected by a reflective electrode can be improved, whereby the efficiency with which light is guided out from an organic EL element can be improved.

In specific, so as to provide a reflective electrode (i.e., an anode) with high reflectivity, a reflective electrode is commonly formed by using a film (an Ag film) composed of Ag or an alloy of Ag, or a film (an Al film) composed of Al or an alloy of Al. A reflective electrode is commonly formed by using Ag or Al since Ag and Al are metals having light-reflecting properties. Further, when performing a comparison between Ag films and Al films, Al films are superior in terms of cost than Ag films. Hence, the use of an Al film as a reflective electrode is more desirable compared to using an Ag film as a reflective electrode, especially when the size of a manufacturing target device, which includes organic EL elements, becomes greater.

CITATION LIST

Patent Literature

[Patent Literature 1]
Japanese Patent Application Publication No. 11-054286

[Patent Literature 2]
Japanese Patent Application Publication No. 2004-192890

SUMMARY OF INVENTION

Technical Problem

However, when forming a reflective electrode by using an Al film, a decrease is observed in the reflectivity and the charge injection property of the reflective electrode. Such problems arise since a surface of an Al film undergoes natural oxidation easily. That is, since Al is a metal having high ionization tendency, a surface of an Al film, when exposed to air, easily interacts with oxygen and/or water. When a surface of an Al film undergoes interaction as described above, natural oxide films are formed on the surface of the Al film. Such natural oxide films have characteristics of absorbing light and inhibiting transportation of charges (electrons and holes).

In addition, when using an Al film as a reflection layer, there is a risk of a hillocks being formed in the Al film and the hillocks being so formed penetrating through organic layers, such as a light-emitting layer. The forming of hillocks in an Al film occurs due to a thermal expansion coefficient of the Al film considerably differing from thermal expansion coefficients of layers such as a substrate and an interlayer insulating layer, above which the Al film is formed. When a hillock formed in an Al film penetrates organic layers formed thereabove, a short circuit occurs between the Al film (i.e., the reflective electrode/the anode) and a cathode. Further, even when the above-described situation where organic layers are penetrated by a hillock does not occur, the formation of a hillock in an Al film leads to local electric field concentration taking place. The generation of local electric field concentration in an organic EL element is problematic since, when local electric field concentration occurs at a given portion of the organic EL element, degradation of the portion is accelerated, and as a result, the lifespan of the organic EL element is shortened.

In view of such problems, the present invention provides an organic EL element which includes an Al film as a reflective electrode and thereby realizes improved cost efficiency compared to an organic EL element including an Ag film as a reflective electrode. At the same time, the organic EL element pertaining to the present invention realizes excellent light-emitting efficiency and inhibits the occurrence of a short circuit between electrodes and the occurrence of electric field concentration. In addition, the present invention also provides a display panel and a display apparatus provided with the organic EL element pertaining to the present invention.

Solution to Problem

One aspect of the present invention is an organic EL element comprising: a transparent electrode (i.e., a light-transmissive electrode having light-transmitting characteristics); a reflective electrode opposite the transparent electrode; and a light-emitting layer between the transparent electrode and the reflective electrode, the light-emitting layer having a film thickness of 20 nm to 200 nm, wherein the reflective electrode is a layered film of a metal film including Al as a main component; and a Ni film layered with respect to an entirety of a surface, facing the light-emitting layer, of the metal film, without interposition of an oxide layer ($AlO_x$) that covers the surface of the metal film facing the light-emitting layer entirely. Further, the organic EL element pertaining to one aspect of the present invention fulfills the following conditions.

A film thickness of the metal film is at least 43 nm.

A film thickness d of the Ni layer satisfies: 0 nm<d<5 nm.

An average roughness Ra of a surface of the layered film facing the light-emitting layer satisfies: 0.6 nm≤Ra<2.0 nm.

A maximum height difference Rmax of the surface of the layered film satisfies: 5 nm≤Rmax<20 nm.

Advantageous Effects of the Invention

The organic EL element pertaining to one aspect of the present invention includes a reflective electrode that is formed so as to include a metal film including Al as a main component. Due to this, the material cost of the organic EL element pertaining to one aspect of the present invention is lower than the material cost of an organic EL element including an Ag film as a reflective electrode. This difference in material cost between the organic EL element pertaining to one aspect of the present invention and an organic EL element including an Ag film as a reflective electrode leads to a great advantage of the present invention over conventional technology especially when the size of a manufacturing target device, which includes organic EL elements, becomes greater.

In addition, the organic EL element pertaining to one aspect of the present invention includes, as the reflective electrode, a layered film of: a metal film including Al as a main component; and a Ni film layered with respect to an entirety of a surface, facing a light-emitting layer, of the metal film, without interposition of an oxide layer that covers the surface of the metal film facing the light-emitting layer entirely. As such, compared to when a natural oxide layer is formed on the surface of the Al film, the absorption of light by the reflective electrode is suppressed, and the formation of a barrier inhibiting the transportation of charges from the reflective electrode is suppressed. That is, since the forming of a natural oxide layer on the surface of the Al film is suppressed in the organic EL element pertaining to one aspect of the present invention, the absorption of light by the reflective electrode is suppressed, and further, ohmic contact is realized within the reflective electrode. As such, the reflective electrode is provided with an improved charge injection property. Further, in the organic EL element pertaining to one aspect of the present invention, the surface, facing the light-emitting layer, of the metal film is covered by the Ni film. Due to this, a natural oxide layer is prevented from being newly formed at a surface portion of the metal film including Al as the main component.

In addition, the organic EL element pertaining to one aspect of the present invention achieves excellent light-emitting efficiency since, in the reflective electrode, the film thickness of the metal film is at least 43 nm, and the film thickness d of the Ni layer satisfies: 0 nm<d<5 nm. Concerning the film thickness of the metal film including Al as the main component, when the film thickness of the metal film is smaller than 43 nm, a reduction occurs in the amount of light emitted from the light-emitting layer towards the side of the reflective electrode and then reflected by the reflective electrode towards the side of the transparent electrode. By providing the metal film with a film thickness of at least 43 nm, the above-described reduction in the amount of light reflected by the reflective electrode towards the transparent electrode is suppressed. In addition, by providing the Ni layer with a film thickness d smaller than 5 nm, the light emitted from the light-emitting layer towards the reflective electrode is reflected at the surface portion of the metal film.

In addition, in the organic EL element pertaining to one aspect of the present invention, an average roughness Ra of a surface of the layered film facing the light-emitting layer satisfies: 0.6 nm≤Ra<2.0 nm, and a maximum height difference Rmax of the surface of the layered film satisfies: 5 nm≤Rmax<20 nm. Due to this, irregular reflection of light at a surface portion of the layered film (i.e., the reflective electrode) is suppressed. As such, the organic EL element pertaining to one aspect of the present invention realizes high reflectivity. In addition, by defining the average roughness Ra and the maximum height difference Rmax of the reflective electrode so as to satisfy the respective conditions (0.6 nm≤Ra<2.0 nm and 5 nm≤Rmax<20 nm), the reflective electrode is prevented from penetrating through organic layers. Due to this, problems such as the occurrence of a short circuit between the electrodes and the occurrence of electric field concentration can be prevented.

As such, since the organic EL element pertaining to one aspect of the present invention includes an Al film as a reflective electrode, improved cost efficiency is realized compared to an organic EL element including an Ag film as a reflective electrode. At the same time, the organic EL element pertaining to one aspect of the present invention realizes excellent light-emitting efficiency and inhibits the occurrence of a short circuit between electrodes and the occurrence of electric field concentration.

BRIEF DESCRIPTION OF DRAWINGS

FIG. 5C is a diagram illustrating I-V characteristics of the Al/Ni layered film, whereas

FIGS. 13A through 13C are schematic cross-sectional views each illustrating a state of replacement with a Ni film 1032 at a different processing duration from commencement of electroless plating processing performed with respect to a layered film having a metal oxide layer 1037 formed at the surface portion thereof, and FIGS. 13E through 13G are schematic diagrams each illustrating a surface state at a corresponding processing duration, whereas FIG. 13D is a schematic cross-sectional view of a metal film 9031 formed in a comparative example where the processing duration of the electrode plating processing is extended, and FIG. 13H is a schematic diagram illustrating a surface state at the extended processing duration.

DESCRIPTION OF EMBODIMENTS

Figure 1:
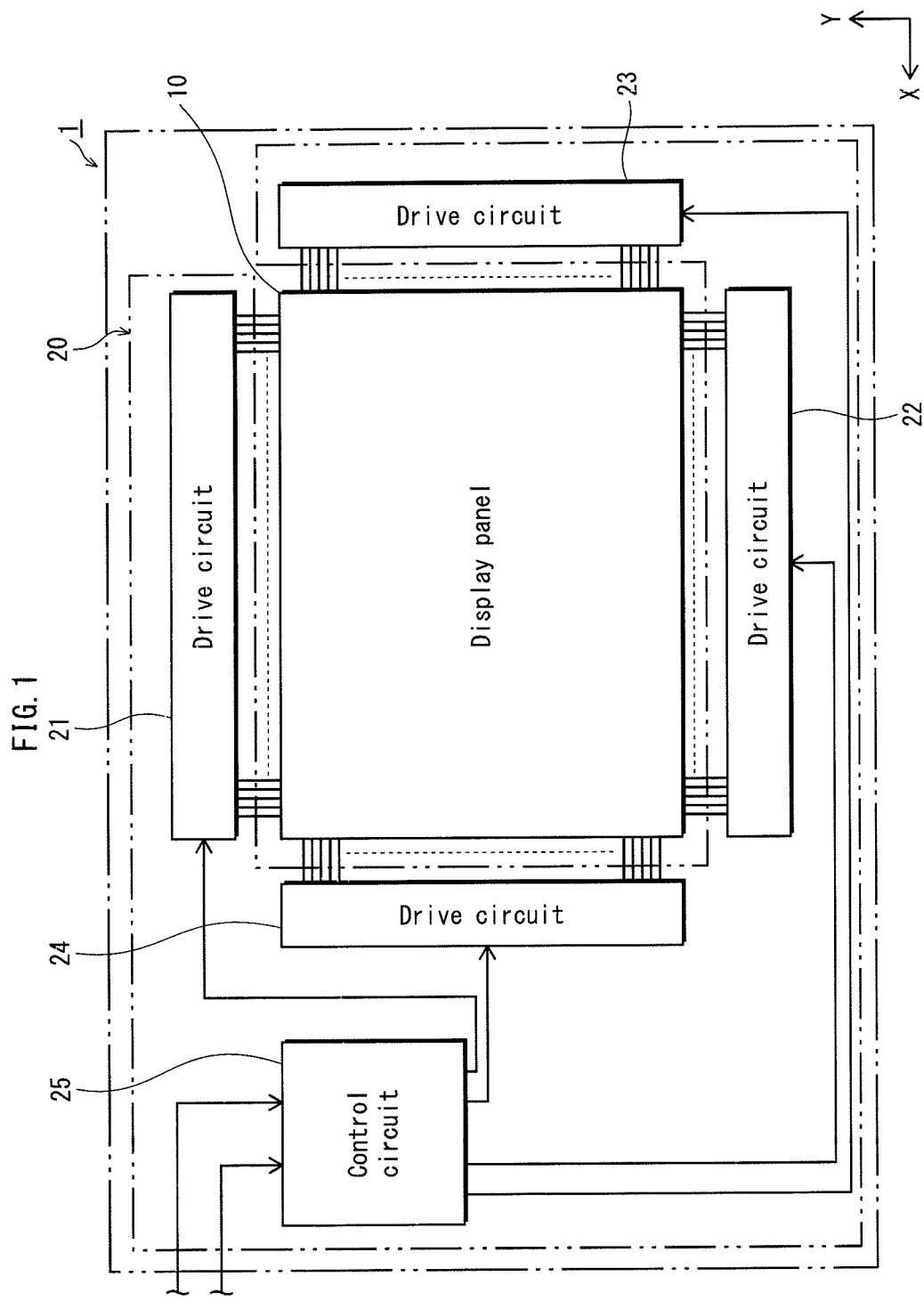
FIG. 1 is a schematic block diagram illustrating a structure of a display device 1 pertaining to embodiment 1 of the present invention.

[Overview of Aspects of the Present Invention]

One aspect of the present invention is an organic EL element comprising: a transparent electrode; a reflective electrode opposite the transparent electrode; and a light-emitting layer between the transparent electrode and the reflective electrode, the light-emitting layer having a film thickness of 20 nm to 200 nm, wherein the reflective electrode is a layered film of: a metal film including Al as a main component; and a Ni film layered with respect to an entirety of a surface, facing the light-emitting layer, of the metal film, without interposition of an oxide layer that covers the surface of the metal film facing the light-emitting layer entirely. Further, the organic EL element pertaining to one aspect of the present invention fulfills the following conditions.

A film thickness of the metal film is at least 43 nm.
A film thickness d of the Ni layer satisfies: 0 nm<d<5 nm.
An average roughness Ra of a surface of the layered film facing the light-emitting layer satisfies: 0.6 nm≤Ra<2.0 nm.
A maximum height difference Rmax of the surface of the layered film satisfies: 5 nm≤Rmax<20 nm.

The organic EL element pertaining to one aspect of the present invention includes a reflective electrode that is formed so as to include a metal film including Al as a main component. Due to this, a material cost of the organic EL element pertaining to one aspect of the present invention is lower than a material cost of an organic EL element including an Ag film as a reflective electrode. This difference in material cost between the organic EL element pertaining to one aspect of the present invention and an organic EL element including an Ag film as a reflective electrode leads to a great advantage of the present invention over conventional technology especially when the size of a manufacturing target device, which includes organic EL elements, becomes greater.

In addition, in the organic EL element pertaining to one aspect of the present invention, the film thickness of the light-emitting layer is defined as being within a range of 20 nm to 200 nm. This is for the following reasons.

In general, it is desirable that organic layers of an organic EL element be provided with a total film thickness of at least 20 nm so as to prevent the organic layers from being affected by a phenomenon commonly referred to as cathode quenching. In specific, the organic layers may be provided with a total film thickness of 20 nm or greater by providing a light-emitting layer having a film thickness of 20 nm or greater, or alternatively, by additionally providing either one of or a combination of an electron transport layer and a hole transport layer and thereby providing the organic layers with a total film thickness of 20 nm or greater.

On the other hand, when organic layers in an organic EL element are provided with a total film thickness greater than 200 nm, high voltage needs to be applied to the organic EL element. This is problematic, since heat generated by the application of high voltage would have a great effect on the organic EL element. Due to this, so as to prevent degradation of an organic EL element, it is desirable that organic layers included in an organic EL element be provided with a total film thickness of 200 nm or smaller.

Further, the organic EL element pertaining to one aspect of the present invention includes, as the reflective electrode, the layered film of the metal film, which includes Al as the main component, and the Ni film layered with respect to the entirety of the surface, facing the light-emitting layer, of the metal film, without interposition of an oxide layer that covers the surface of the metal film facing the light-emitting layer entirely. As such, compared to when a natural oxide layer is formed on the surface the Al film, the absorption of light by the reflective electrode is suppressed, and the formation of a barrier inhibiting the transportation of charges from the reflective electrode is suppressed. That is, since the forming of a natural oxide layer on the surface of the Al film is suppressed in the organic EL element pertaining to one aspect of the present invention, the absorption of light by the reflective electrode is suppressed, and further, ohmic contact is realized within the reflective electrode. As such, the reflective electrode has an improved charge injection property. Further, in the organic EL element pertaining to one aspect of the present invention, the surface, facing the light-emitting layer, of the metal film is covered by the Ni film. Due to this, a natural oxide layer is prevented from being newly formed at the surface portion of the metal film including Al as the main component.

As described above, a natural oxide layer is prevented from being formed as a result of the surface of the metal film being covered by the Ni film. This is since Ni has lower ionization tendency compared to Al, and therefore, it is unlikely for Ni to undergo oxidation in air, and also, it is unlikely for Ni to undergo interaction with water.

In addition, the organic EL element pertaining to one aspect of the present invention achieves excellent light-emitting efficiency since, in the reflective electrode, the film thickness of the metal film is at least 43 nm, and the film thickness d of the Ni layer satisfies: 0 nm<d<5 nm. Concerning the film thickness of the metal film including Al as the main component, when the film thickness of the metal film is smaller than 43 nm, a reduction occurs in the amount of light emitted from the light-emitting layer towards the side of the reflective electrode and then reflected by the reflective electrode towards the side of the transparent electrode, which is problematic. By providing the metal film with a film thickness of at least 43 nm, the above-described reduction in the amount of light reflected by the reflective electrode towards the transparent electrode is suppressed. In addition, by providing the Ni layer with a film thickness d smaller than 5 nm, the light emitted from the light-emitting layer towards the reflective electrode is reflected at the surface portion of the metal film.

In addition, in the organic EL element pertaining to one aspect of the present invention, the average roughness Ra of the surface of the layered film facing the light-emitting layer satisfies: 0.6 nm≤Ra<2.0 nm, and the maximum height difference Rmax of the surface of the layered film satisfies: 5 nm≤Rmax<20 nm. Due to this, irregular reflection of light at the surface portion of the layered film (i.e., the reflective electrode) is suppressed. As such, the organic EL element pertaining to one aspect of the present invention realizes high reflectivity. In addition, by defining the average roughness Ra and the maximum height difference Rmax of the reflective electrode so as to satisfy the respective conditions (0.6 nm≤Ra<2.0 nm and 5 nm≤Rmax<20 nm), the reflective electrode is prevented from penetrating through organic layers. Due to this, problems such as the occurrence of a short circuit between the electrodes and the occurrence of electric field concentration can be prevented.

As such, since the organic EL element pertaining to one aspect of the present invention includes an Al film as a reflective electrode, improved cost efficiency is realized compared to an organic EL element including an Ag film as a reflective electrode. At the same time, the organic EL element pertaining to one aspect of the present invention realizes excellent light-emitting efficiency and inhibits the occurrence of a short circuit between electrodes and the occurrence of electric field concentration.

Here, note that the maximum height difference Rmax and the average roughness Ra can be measured, for instance, by using an atomic force microscope (AFM). In specific, the maximum height difference Rmax refers to a difference between a maximum height and a minimum height of the surface of the reflective electrode measured along a direction perpendicular to the surface of the reflective electrode. Further, the average roughness Ra refers to an average of heights of the surface of the reflective electrode measured along the direction perpendicular to the surface of the reflective electrode. The average of heights is calculated by calculating the difference between a center plane and heights at different measurement points.

In the organic EL element pertaining to one aspect of the present invention, the maximum height difference Rmax may satisfy: 5 nm≤Rmax<17 nm. By defining the maximum height difference Rmax of the surface of the layered film facing the light-emitting layer so as to satisfy: 5 nm≤Rmax<17 nm, the reflective electrode is prevented from penetrating through organic layers included in the organic EL element with a higher degree of certainty. Due to this, problems such as the occurrence of a short circuit between electrodes and the occurrence of electric field concentration can be prevented with a higher degree of certainty.

The organic EL element pertaining to one aspect of the present invention may further comprise a bank defining a plurality of apertures each corresponding to one of the reflective electrodes, wherein the light-emitting layer may be provided in plurality such that each light-emitting layer is positioned inside a corresponding one of the apertures, and both end portions of each reflective electrode may be covered by the bank at least in one cross-sectional direction through the reflective electrode. By providing the organic EL element pertaining to one aspect of the present invention with the above-described structure where both end portions of the reflective electrode are covered by the bank, problems such as the occurrence of electric field concentration and the occurrence of short circuits are prevented from occurring at the end portions of the reflective electrode.

With regards to the end portions of the reflective electrode, if the end portions of the reflective electrode were to be patterned by etching so as to be substantially perpendicular to a surface of the substrate, certain problems would arise. That is, when organic layers including the light-emitting layer are later disposed on the reflective electrode, the organic layers would not cover the end portions of the reflective electrode sufficiently or the film thickness of the organic layers at the end portions of the reflective electrode would be insufficiently thin. Such cases are problematic, resulting in problems such as the occurrence of electric field concentration and the occurrence of a short circuit between the reflective electrode and the electrode opposite the reflective electrode (i.e., the transparent electrode, which is the top electrode in a top-emission type organic EL element).

As a countermeasure for preventing the occurrence of electric field concentration and the occurrence of a short circuit between the reflective electrode and the electrode opposite the reflective electrode, tapering of the end portions of the reflective electrode may be performed.

However, when tapering is performed of the end portions of the reflective electrode, unevenness is formed on the tapered surfaces of the end portions of the reflective electrode. As such, a flat reflective surface cannot be realized.

In view of such problems, the organic EL element pertaining to one aspect of the present invention is provided with the above-described structure where both end portions of the reflective electrode are covered by the bank. Due to this, problems such as the occurrence of electric field concentration and the occurrence of a short circuit between the reflective electrode and the electrode opposite the reflective electrode are prevented from occurring at end portions of the reflective electrode. In addition, since the end portions of the reflective electrode are covered by the bank, the reflective electrode realizes uniform reflective characteristics even when tapering of the end portions of the reflective electrode is performed.

In the organic EL element pertaining to one aspect of the present invention, oxide films may be formed on the surface of the metal film facing the light-emitting layer as discrete islands or as portions of a discontinuous film. Here, it should be noted that, in the present disclosure, an "oxide layer" is formed over an entirety of a surface of a baselayer. Therefore, the term "oxide layer" refers to a layer covering the entire surface of the baselayer. On the other hand, "oxide films" are formed at portions of a surface of a baselayer. More specifically, "oxide films" refer to films in the form of discrete islands or in the form of portions of a discontinuous film formed on the surface of the baselayer.

Here, it should be noted that, even when the organic EL element pertaining to one aspect of the present invention is provided with the above-described structure where oxide films are formed on the surface of the metal film facing the light-emitting layer as discrete islands or as portions of a discontinuous film, the rest of the portions of the surface of the metal film including Al as the main component is covered by the Ni film. Hence, as already described above, a natural oxide layer is prevented from being newly formed on a surface portion of the metal film including AL as the main component, and as a result, the high reflectivity of the organic EL element pertaining to one aspect of the present invention is maintained.

The organic EL element pertaining to one aspect of the present invention may further comprise a transparent conductive film between the reflective electrode and the light-emitting layer. When the organic EL element pertaining to one aspect of the present invention is provided with the above-described structure where the transparent conductive film is interposed between the reflective electrode and the light-emitting layer, the adjustment of a distance between the light-emitting layer and the surface portion of the reflective electrode can be performed with ease by adjusting the film thickness of the transparent conductive film. This results in increased flexibility in designing an optical cavity structure in the organic EL element pertaining to one aspect of the present invention, and hence, the organic EL element pertaining to one aspect of the present invention is provided with excellent light-emitting efficiency.

When the organic EL element pertaining to one aspect of the present invention is provided with the above-described structure where the transparent conductive film is interposed between the reflective electrode and the light-emitting layer, the transparent conductive film may comprise indium tin oxide (ITO), indium zinc oxide (IZO), or a metal oxide other than ITO or IZO.

The organic EL element pertaining to one aspect of the present invention may further comprise a charge injection layer between the reflective electrode and the light-emitting layer. When the organic EL element pertaining to one aspect of the present invention is provided with the above-described structure where the charge injection layer is disposed between the reflective electrode and the light-emitting layer, the charge injection property upon injection of charges from the reflective electrode to the light-emitting layer is improved. Due to this, the light-emitting characteristics of the organic EL element pertaining to one aspect of the present invention are improved. Further, when the organic EL element pertaining to one aspect of the present invention is provided with the above-described structure where the charge injection layer is disposed between the reflective electrode and the light-emitting layer, the organic EL element pertaining to one aspect of the present invention may further comprise a charge transport layer between the charge injection layer and the light-emitting layer.

When the organic EL element pertaining to one aspect of the present invention is provided with the above-described structure where the charge injection layer is disposed between the reflective electrode and the light-emitting layer, the charge injection layer may be a layer that comprises a metal oxide, a metal nitride, or a metal oxynitride. When the charge injection layer is a layer constituted of a metal oxide, a metal nitride, or a metal oxynitride, the organic EL element pertaining to one aspect of the present invention realizes superior voltage-current density characteristics compared to when the charge injection layer is a layer constituted of an organic material. In addition, when the charge injection layer is a layer constituted of a metal oxide, a metal nitride, or a metal oxynitride, it is unlikely for the organic EL element pertaining to one aspect of the present invention to undergo degradation even when a great current is caused to flow therethrough so as to achieve high light-emitting intensity.

In specific, when the organic EL element pertaining to one aspect of the present invention is provided with the above-described structure where the charge injection layer is disposed between the reflective electrode and the light-emitting layer, the charge injection layer may be a layer that comprises tungsten (W) oxide or molybdenum (Mo) oxide.

One aspect of the present invention is a display panel comprising the organic EL element pertaining to one aspect of the present invention. By the display panel pertaining to one aspect of the present invention being provided with such a structure, the display panel pertaining to one aspect of the present invention realizes all of the advantageous effects described above which are realized by the organic EL element pertaining to one aspect of the present invention.

One aspect of the present invention is a display panel having a plurality of pixels, comprising: a reflective electrode for each of the pixels; a bank defining an aperture corresponding to the reflective electrode; a light-emitting layer positioned inside the aperture; and a transparent electrode above the light-emitting layer, wherein the bank covers both end portions of the reflective electrode at least in one cross-sectional direction through the reflective electrode, the reflective electrode is a layered film of: a metal film including Al as a main component; and a Ni film layered with respect to an entirety of a surface, facing the light-emitting layer, of the metal film, without interposition of an oxide layer that covers the surface of the metal film facing the light-emitting layer entirely. Further, the organic EL element pertaining to one aspect of the present invention fulfills the following conditions.

A film thickness d of the Ni layer satisfies: 0 nm<d<5 nm.

An average roughness Ra of the surface of the metal film satisfies: 0.6 nm≤Ra<2.0 nm.

A maximum height difference Rmax of the surface of the metal film satisfies: 5 nm≤Rmax<20 nm.

By providing the display panel pertaining to one aspect of the present invention with the above-described structure where both end portions of the reflective electrode are covered by the bank, problems such as the occurrence of electric field concentration and the occurrence of a short circuit between the reflective electrode and the electrode opposite the reflective electrode are prevented from occurring at the end portions of the reflective electrode. In addition, since the end portions of the reflective electrode are covered by the bank, the reflective electrode realizes uniform reflective characteristics even when tapering of the end portions of the reflective electrode is performed.

In the display panel pertaining to one aspect of the present invention, the aperture may be provided in plurality so as to correspond one-to-one with the plurality of reflective electrodes. That is, the display panel pertaining to one aspect of the present invention may have a so-called "pixel bank" structure.

In the display panel pertaining to one aspect of the present invention, the plurality of reflective electrodes may be arranged so as to form a plurality of lines, and the aperture may be provided in plurality so as to correspond one-to-one with the plurality of lines of the reflective electrodes. That is, the display panel pertaining to one aspect of the present invention may have a so-called "line bank" structure.

One aspect of the present invention is a display device comprising the display panel pertaining to one aspect of the present invention. By the display device pertaining to one aspect of the present invention being provided with such a structure, the display device pertaining to one aspect of the present invention realizes all of the advantageous effects described above which are realized by the display panel pertaining to one aspect of the present invention.

In the following, description is provided on embodiments of the present invention by referring to several exemplary examples of implementation.

Note that, the embodiments described in the following are examples taken for the mere sake of providing a clear description of the structures and effects of the present invention. As such, while the embodiments include description on fundamental aspects for implementing the present invention, the present invention should not be construed as being limited to the following embodiments.

[Embodiment 1]

1. Overall Structure of Display Device 1

In the following, description is provided on a structure of a display device 1, which includes an organic EL element pertaining to embodiment 1, with reference to FIG. 1.

As illustrated in FIG. 1, the display device 1 includes a display panel 10 and a drive control unit 20 connected with the display panel 10. The display panel 10 is a panel that makes use of the phenomenon of electroluminescence occurring in organic material and is composed of a plurality of organic EL elements that are arranged, for instance, so as to form a matrix. The drive control unit 20 includes four drive circuits, namely drive circuits 21 through 24, and a control circuit 25.

Note that, when actually implementing the display device 1, the placement of the drive control unit 20 with respect to the display panel 10 is not limited to that described above.

2. Structure of Display Panel 10

Figure 2:
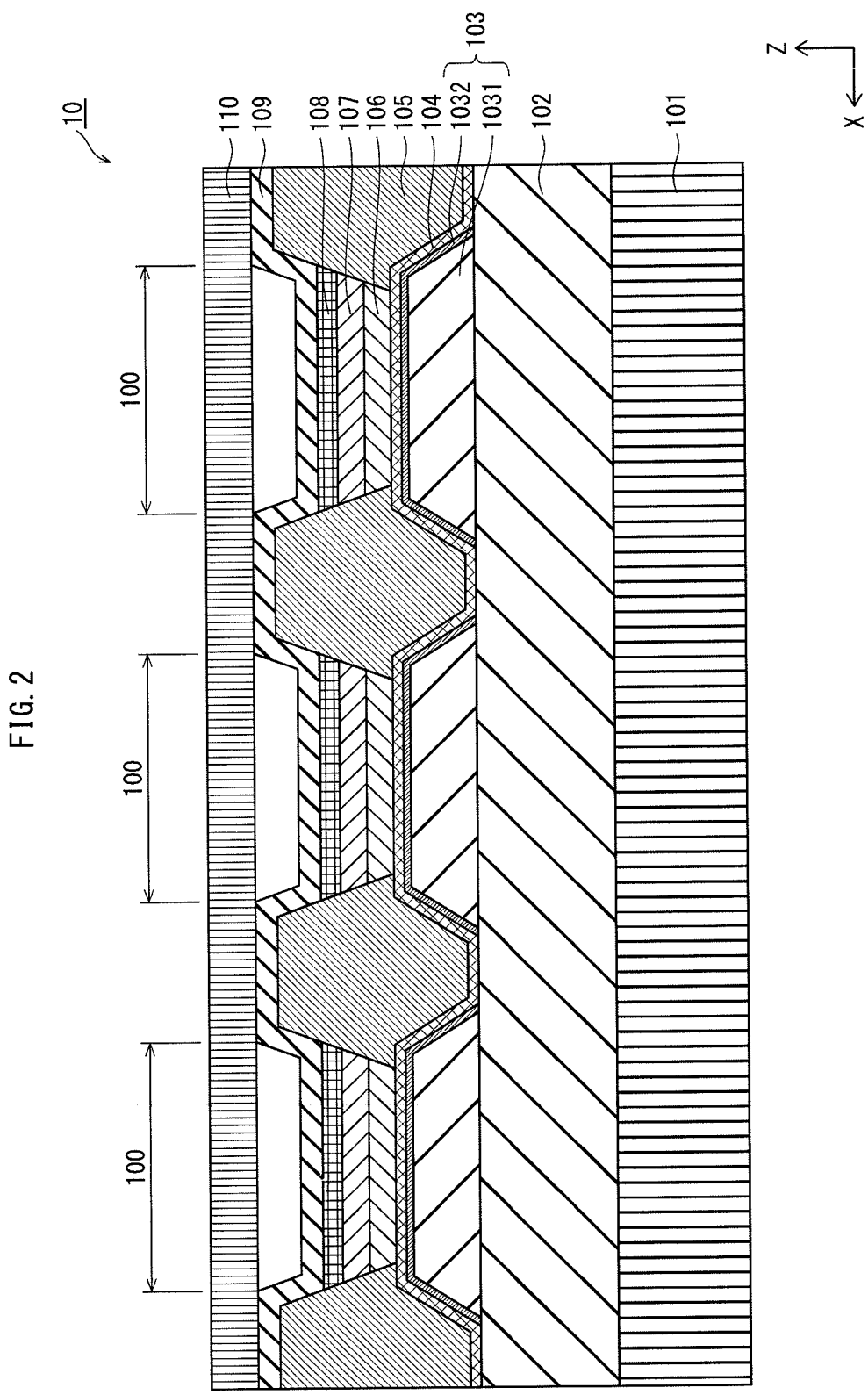
FIG. 2 is a schematic cross-sectional view illustrating a structure of a display panel 10 in the display device 1.
Figure 3:
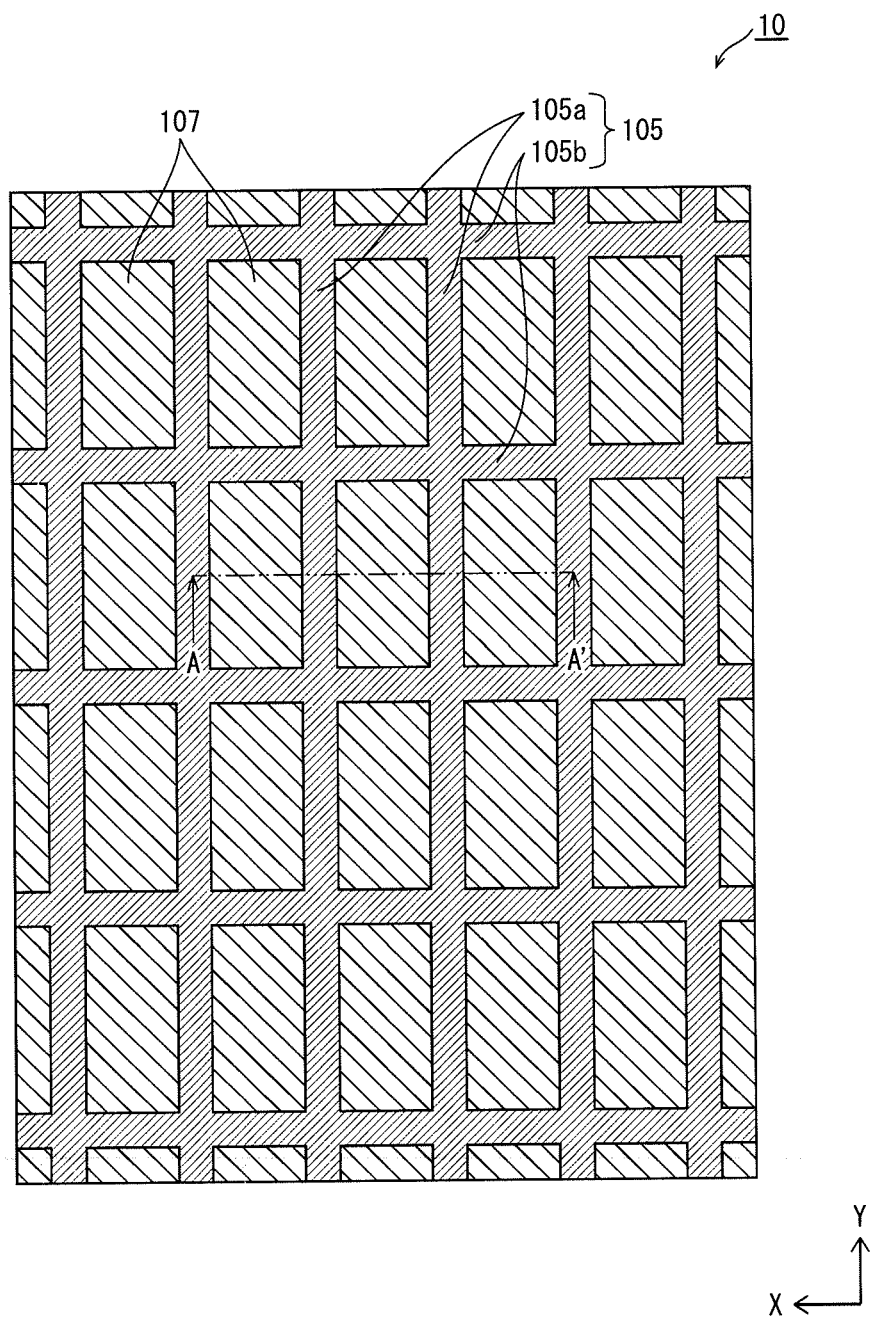
FIG. 3 is a schematic plan view illustrating a bank 105 in the display panel 10.

In the following, description is provided on a structure of the display panel 10, with reference to FIGS. 2 and 3. FIG. 2 is a cross-sectional view of a part of the structure of the display panel 10. FIG. 3 is a plan view of some elements constituting the display panel 10. Note that FIG. 2 is a cross-sectional diagram taken along a cross-section A-A' in FIG. 3.

As illustrated in FIG. 2, the display panel 10 includes a substrate 101, which serves as a baselayer above which other layers are formed. Above the substrate 101, a thin film transistor (TFT) layer and a passivation film are formed in the stated order (note that the TFT layer and the passivation film are not illustrated in FIG. 2). Further, an interlayer insulating layer 102 is layered onto the passivation film so as to cover the passivation film.

The interlayer insulating layer 102 serves as an insulating layer. Further, in each area above the substrate 101 corresponding to one of pixels 100 of the display panel 10, a reflective electrode 103 is formed above the interlayer insulating layer 102. Further, a charge injection layer 104 is layered on the reflective electrode 103 so as to cover the reflective electrode 103. In addition, a bank 105 is formed above the charge injection layer 104. The bank 105 defines apertures corresponding one-to-one with the pixels 100.

The reflective electrode 103 functions as an anode and is a layered film of a metal film 1031 and a nickel (Ni) film 1032. The metal film 1031 is constituted of a metal including aluminum (Al) as a main component. Here, it should be noted that the reflective electrode 103 includes the metal film 1031 and the Ni film 1032 layered one on top of the other without interposition of an oxide layer of Al extending over an entirety of a surface of the metal layer 1031 with respect to which the Ni film 1032 is layered. Here, as already discussed above, the "oxide layer", when formed, covers an entirety of the surface of the metal film 1031, which corresponds to the baselayer. In other words, the term "oxide layer" should not be construed as encompassing oxidized portions (i.e., "oxide films") formed on the surface of the metal film 1031 in the form of discrete islands or in the form of portions of a discontinuous film. Therefore, it is to be noted that a case where oxide films are formed on the surface of the metal film 1031 is permissible.

Within each of the apertures defined by the bank 105, a charge transport layer 106, an organic light-emitting layer 107, and an electron transport layer 108 are layered in the stated order above the charge injection layer 104. Here, note that both end portions of the reflective electrode 103 in the X-axis direction in FIG. 2 are tapered and covered by the bank 105.

In the following, description is provided on a positional relationship between the bank 105 and the organic light-emitting layer 107 in the display panel 10, with reference to FIG. 3.

As illustrated in FIG. 3, the bank 105 in the display panel 10 is a so-called "pixel bank", and includes bank elements 105a extending in the Y-axis direction in FIG. 3 and bank elements 105b extending in the X-axis direction in FIG. 3. The bank elements 105a and 105b are formed integrally. Further, as illustrated in FIG. 3, each aperture defined by the bank 105 corresponds to one of the pixels 100 of the display panel 10, and within each aperture, the organic light-emitting layer 107 is disposed.

Returning to FIG. 2, a transparent electrode 109 is formed on the electron transport layer 108 and an upper surface of the bank 105. The transparent electrode functions as a cathode. Further, although not illustrated in FIG. 2, a sealing layer is disposed on the transparent electrode 109. Further in addition, an upper substrate 110 is mounted onto the transparent electrode 109.

In the display panel 10, holes are injected from the reflective electrode 103, which serves as the anode, and electrons are injected from the transparent electrode 109, which serves as the cathode. The holes and electrons recombine in the organic light-emitting layer 107, which causes the emission of light. The light emitted from the organic light-emitting layer 107 includes first light components and second light components. The first light components correspond to light emitted from the organic light-emitting layer 107 towards the direction of the transparent electrode 109, which is located upwards in the Z-axis direction in FIG. 2 from the organic light-emitting layer 107. The second light components correspond to light emitted from the organic light-emitting layer 107 towards the direction of the reflective electrode 103, which is located downwards in the Z-axis direction in FIG. 2 from the organic light-emitting layer 107. The second light components emitted towards the direction of the reflective electrode 103 are reflected by a surface and a sub-surface portion (note that herein, a combination of a surface and a sub-surface portion is also referred to as "a surface portion"), facing the organic light-emitting layer 107, of the metal film 1031. The second light components, after being reflected as described above, travels in the direction of the transparent electrode 109. As such, the surface portion of the metal film 1031 serves as a reflector having a predetermined level of reflectivity.

Further, in the display panel 10 pertaining to the present embodiment, a film thickness of the organic light-emitting layer 107 is within a range of 20 nm to 200 nm, a film thickness of the metal film 1031 is at least 43 nm, and a film thickness d of the Ni film 1032 formed on the metal film 1031 satisfies: $0 < d < 5$ nm.

In addition, within each of the pixels 100 of the display panel 10, an average roughness Ra of the surface of the reflective electrode 103 facing the organic light-emitting layer 107 satisfies: 0.6 nm≤Ra<2.0 nm, and a maximum height difference Rmax of the surface of the reflective electrode 103 facing the organic light-emitting layer 107 satisfies: 5 nm≤Rmax<20 nm. Here, note that it is further desirable to adjust the maximum height difference Rmax of the surface of the reflective electrode 103 facing the organic light-emitting layer 107 so as to satisfy: 5 nm≤Rmax<17 nm.

3. Examples of Materials for Forming Elements Constituting Display Panel 10 a) Substrate 101

The substrate 101 is formed by using, as a main component thereof, an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

b) Interlayer Insulating Layer 102

The interlayer insulating layer 102 is formed by using an organic compound such as polyimide, polyamide, and acrylic resin material.

c) Reflective Electrode 103

As already discussed above, the metal film 1031, which is included in the reflective electrode 103, is constituted of a metal including Al as a main component. For instance, the metal film 1031 is formed by using Al or an Al alloy. Further, in a top-emission type display panel such as the display panel 10 pertaining to the present embodiment, it is desirable that a surface portion of the metal film 1031 have high reflectivity.

In addition, the Ni film 1032, which is formed on the metal film 1031 so as to cover the metal film 1031, is constituted of Ni.

d) Bank 105

The bank 105 is formed by using an organic material such as resin and has insulating'properties. Examples of the organic material usable to form the bank 105 include acrylic resin, polyimide resin, and novolac-type phenolic resin, etc. It is desirable that the bank 105 have organic solvent resistance. Furthermore, since the bank 105 undergoes processing such as etching, baking, etc., during manufacturing procedures following the forming thereof, it is desirable that the bank 105 be formed by using highly resistant material that does not undergo excessive change in shape or quality during such processing. In addition, a surface of the bank 105 may be fluoridated so as to provide liquid repellency thereto.

Note that the surface of the bank 5 may be provided with liquid repellency particularly when the bank 105 is formed by using liquid-philic material. This is since, when the bank 105 is formed by using liquid-philic material, the difference in liquid philicity/liquid repellency between contacting surfaces of the bank 105 and the organic light-emitting layer 107 would be undesirably small, and as a result, it would be difficult to hold ink for forming the organic light-emitting layer 107, which includes organic material, selectively within the apertures defined by the bank 105 in such a case.

Further, note that the structure of the bank 105 need not be a single-layer structure as illustrated in FIG. 2. Alternatively, the bank 105 may have a multi-layer structure of two or more layers. In such a case, the above materials may be combined for each layer, or layers may alternate between non-organic and organic material.

e) Charge Injection Layer 104

The charge injection layer 104 is, for instance, a layer formed with an oxide such as an oxide of Ag, an oxide of Mo, an oxide of chromium (Cr), an oxide of vanadium (V), an oxide of W, an oxide of Ni, and an oxide of iridium (Ir), or with a conductive polymer material such as PEDOT (a mixture of polythiophene and poly(styrenesulfonate)). In particular, when the charge injection layer 104 is formed with a metal oxide, the charge injection layer 104 is provided with a function of stably injecting charges (holes) into the organic light-emitting layer 107 or with a function of assisting the generation of charges (holes), and has a great work function.

Further, when the charge injection layer 104 is formed with an oxide of a transition metal, a plurality of energy levels can be occupied since there are a plurality of oxidation numbers. This results in easy hole injection and allows for reduction of driving voltage.

f) Charge Transport Layer 106

The charge transport layer 106 is formed by using a high-molecular compound not having a hydrophilic group. For instance, the charge transport layer 106 may be formed by using polyfluorene, derivatives of polyfluorene, polyallylamine, and derivatives of polyallylamine, which are examples of high-molecular compounds not having a hydrophilic group.

g) Organic Light-emitting Layer 107

As discussed above, in the organic light-emitting layer 107, holes and electrons injected thereto recombine, thereby generating an excitation state. As a result, the organic light-emitting layer 107 emits light. As for the material for forming the organic light-emitting layer 107, it is desirable that an organic material having light-emitting characteristics be used, a film of which can be formed by wet printing.

Specifically, it is preferable that the organic light-emitting layer 107 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as disclosed in Japanese Patent Application Publication No. H5-163488.

h) Electron Transport Layer 108

The electron transport layer 108 has a function of transporting electrons injected from the transparent electrode 109, which serves as the cathode, to the organic light-emitting layer 107. The electron transport layer 108 is formed by using, for instance, a derivative of oxadiazole (OXD), a derivative of triazole (TAZ), a derivative of phenanthroline (BCP, Bphen), etc.

i) Transparent Electrode 109

The transparent electrode 109, which functions as the cathode, is formed by using, for instance, indium tin oxide (ITO), indium zinc oxide (IZO), etc. In a top-emission type display panel such as the display panel 10 pertaining to the present embodiment, it is desirable that the transparent electrode 109 be formed with light-transmissive material. Concerning the light-transmitting property of the transparent electrode 109, it is desirable that the transparent electrode 109 have a transparency of 80% or higher.

In addition to the materials presented above, the following materials may be used to form the transparent electrode 109. That is, the transparent electrode 109 may be formed, for instance, as a layer including an alkali metal, a layer including an alkali metal halide, a layer including an alkali earth metal, or a layer including an alkali earth metal halide. Alternatively, the transparent electrode 109 may be formed as a laminate including one of the above-described layers and a layer including Ag laminated in the stated order. When the transparent electrode 109 is formed as a laminate as described above, the layer including Ag may be formed with Ag alone, or with an alloy of Ag. Further, in order to enhance the efficiency with which light is guided out from the display panel 10, a highly light-transmissive refraction index adjustment layer may be provided above the layer including Ag.

j) Sealing Layer

The sealing layer formed on the transparent electrode 109, illustration of which is omitted in FIG. 2, has a function of preventing organic layers such as the organic light-emitting layer 107 from being exposed to water and/or air and is formed, for example, with silicon nitride (SiN), silicon oxynitride (SiON), etc.

In addition, a sealing resin layer formed with a resin material such as acrylic resin and silicone resin may be further disposed above the sealing layer.

In a top-emission type display panel such as the display panel 10 pertaining to the present embodiment, it is desirable that the sealing layer be formed with light-transmissive material.

4. Effects Achieved by Structure of Reflective Electrode 103

In the display panel 10 pertaining to the present embodiment, the reflective electrode 103 is a layered film of the metal film 1031 and the Ni film 1032. In the following, description is provided on the effects that are achieved by the reflective electrode 103 having such a structure, with reference to FIG. 4 and FIGS. 5A through 5D.

First of all, in the display panel 10 pertaining to the present embodiment, the metal film 1031, which includes Al as the main component, is used as an element constituting the reflective electrode 103. As such, the material cost of the display panel 10 pertaining to the present embodiment is lower compared to the material cost of a display panel in which an Ag film is used as a reflective electrode.

Further, even when a reflective-type light-emitting device is provided with the metal film 1031 (Al film) as a reflective film, the forming of a natural oxide layer on the surface of the metal film 1031 is prevented. This is since, the reflective electrode 103 is formed as a layered film of the metal film 1031 and the Ni film 1032 layered with respect to the metal film 1031 so as to be in contact with the surface of the metal film 1031.

Further, by forming the Ni film 1032 to have a film thickness that is far thinner than visible wavelengths, the absorption of light within the Ni film 1032 can be prevented. When the Ni film 1032 is formed so as to have an extremely small film thickness as described above, the metal film 1031 (Al film) is able to fully exhibit the high reflectivity provided thereto. As a result, the reflective electrode 103 pertaining to the present embodiment, being provided with the above-described structure, exhibits an improved level of reflectivity compared to a reflective electrode composed of only an Al film. That is, when a reflective electrode is composed of only an Al film, a natural oxide layer is formed on a surface portion of the reflective electrode, and loss occurs due to absorption of light within the natural oxide layer. Due to this, the reflectivity of a reflective electrode composed of only an Al film is impaired, and hence, is relatively low compared to that of the reflective electrode 103 pertaining to the present embodiment.

Figure 4:
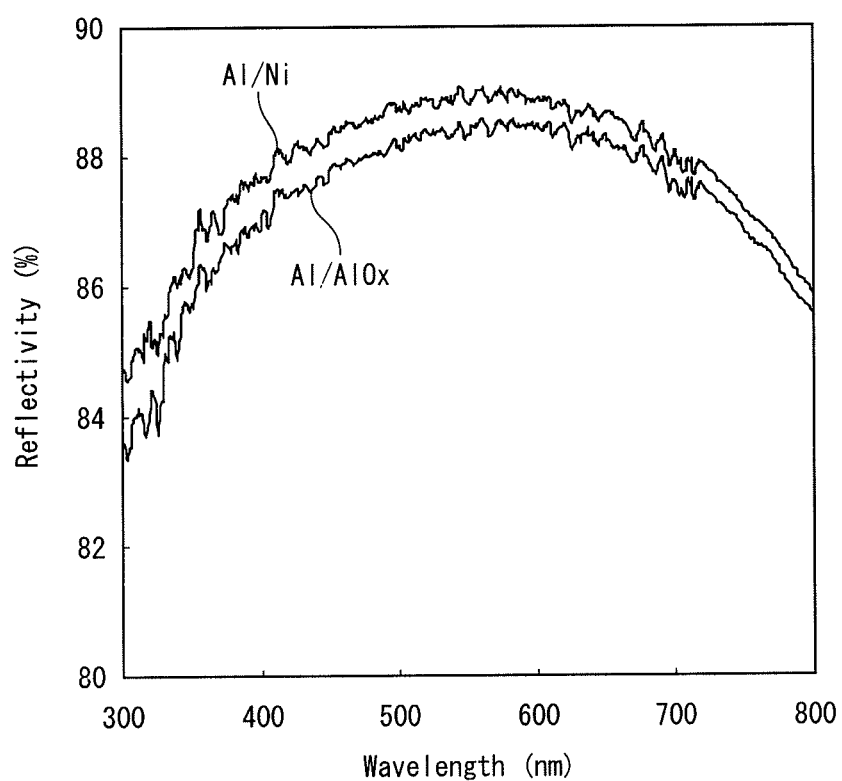
FIG. 4 is a diagram illustrating wavelength/reflectivity characteristics of an Al/Ni layered film.

In specific, when comparing an Al/Ni layered film having the same structure as the reflective electrode 103 pertaining to the present embodiment with an Al film having a natural oxide film formed at a surface portion thereof (an Al/AlO$_X$ film), the Al/Ni layered film exhibits higher reflectivity than the Al/AlO$_X$ film at all measured wavelengths from 300 nm to 800 nm, as illustrated in FIG. 4.

In addition, since the reflective electrode 103 pertaining to the present embodiment has a structure where the Ni film 1032, which is a thin film, is layered with respect to the metal film 1032, which includes Al as the main component thereof, such that the Ni film 1032 is in contact with a surface of the metal film 1032, the forming of a natural oxide layer is suppressed. Due to this, the formation of a barrier that would otherwise be formed in the reflective electrode 103 by the natural oxide layer being formed is prevented, and ohmic contact is realized within the reflective electrode. As such, the reflective electrode 103 pertaining to the present embodiment has improved charge injection efficiency. Hence, undesirable loss of power within the reflective electrode 103 is reduced and the amount of holes/electrons contributing to the emission of light is increased, which further leads to light-emitting efficiency of the reflective electrode 103 with respect to input power being improved.

Figure 5A:
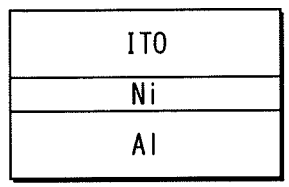
FIG. 5A illustrates a schematic structure of the Al/Ni layered film.
Figure 5C:
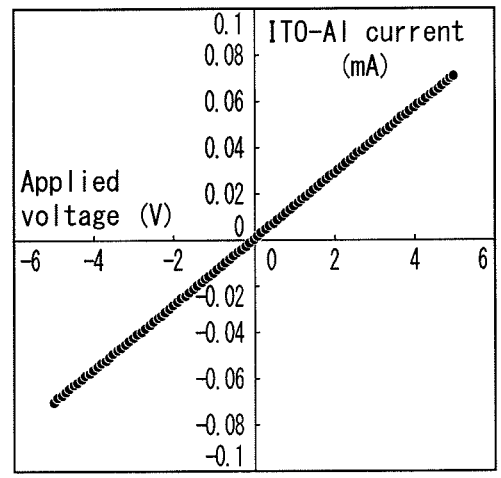
Figure 5B:
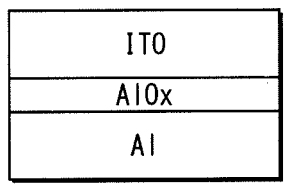
FIG. 5B illustrates a schematic structure of an Al film pertaining to a comparative example whose surface portion is oxidized (Al/AlO$_X$)
Figure 5D:
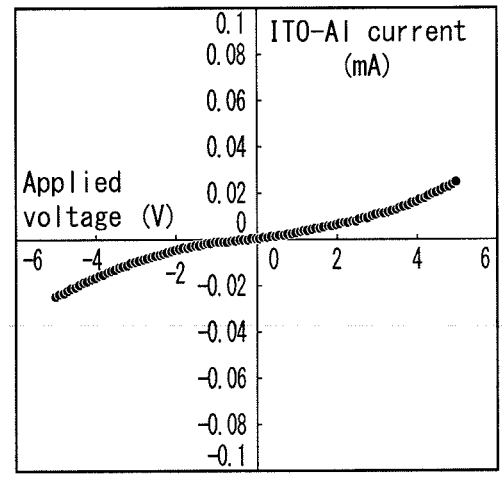
FIG. 5D is a diagram illustrating I-V characteristics of the Al film pertaining to the comparative example.

In specific, in a case of an Al/Ni layered film as illustrated in FIG. 5A, current value changes linearly with respect to voltage value, as illustrated in FIG. 5C. In contrast, in a case of a comparative example as illustrated in FIG. 5B where an oxide layer (AlO$_X$) is formed on a surface portion of an Al film, current value does not change linearly with respect to voltage value, as illustrated in FIG. 5D.

In summary of the description provided above, the reflective electrode 103 pertaining to the present embodiment is a layered film of the metal film 1031 and the Ni film 1032, which is layered on the surface of the metal film 1031 facing the organic light-emitting layer 107 without the interposition of an oxide layer. Due to this, ohmic contact is realized between the metal film 1031 and the Ni film 1032, which results in the reflective electrode 103 achieving excellent light-emitting efficiency. More specifically, as illustrated in FIG. 5B, when an oxide layer (AlO$_X$) is formed on a surface portion of an Al film, an ITO-Al current does not change linearly with respect to input voltage, and also, the ITO-Al current exhibits a relatively small change in response to a change in input voltage. In contrast, as illustrated in FIG. 5C, when an oxide layer is not formed on a surface portion of an Al film and a Ni film is layered with respect to the Al film (i.e., an Al/Ni layered film), the ITO-Al current changes linearly with respect to input voltage, and also, the linear function in FIG. 5C, which represents the change of the ITO-Al current in response to a change in input voltage, exhibits a greater slope than the linear function in FIG. 5D.

5. Effects Achieved by Specifically Defining a Film Thickness of Metal Film 1031 in Reflection Electrode 103

Figure 6:
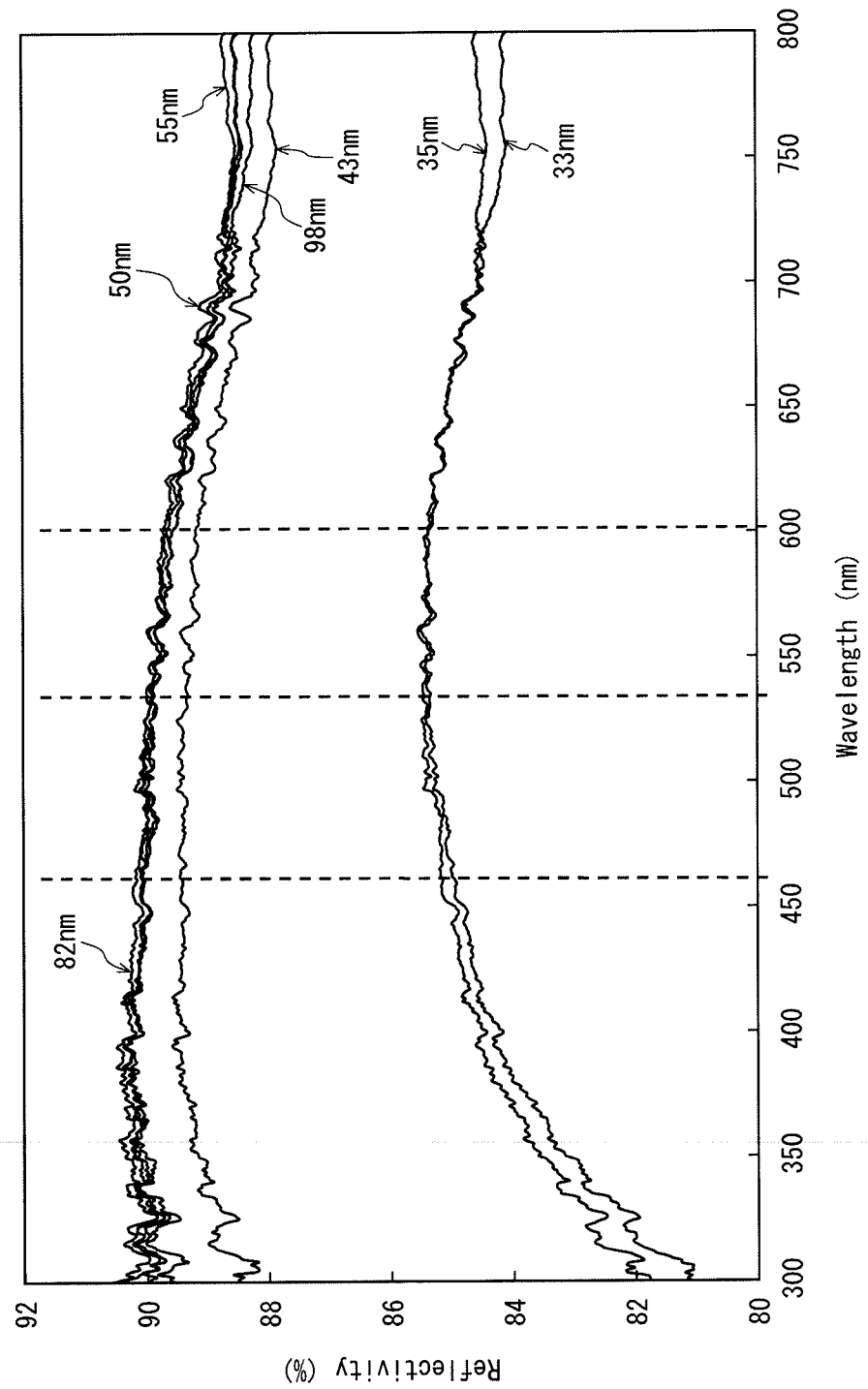
FIG. 6 is a diagram illustrating wavelength/reflectivity characteristics of a metal film 1031 included in a reflective electrode 103, for different film thicknesses of the metal film 1031.
Figure 7:
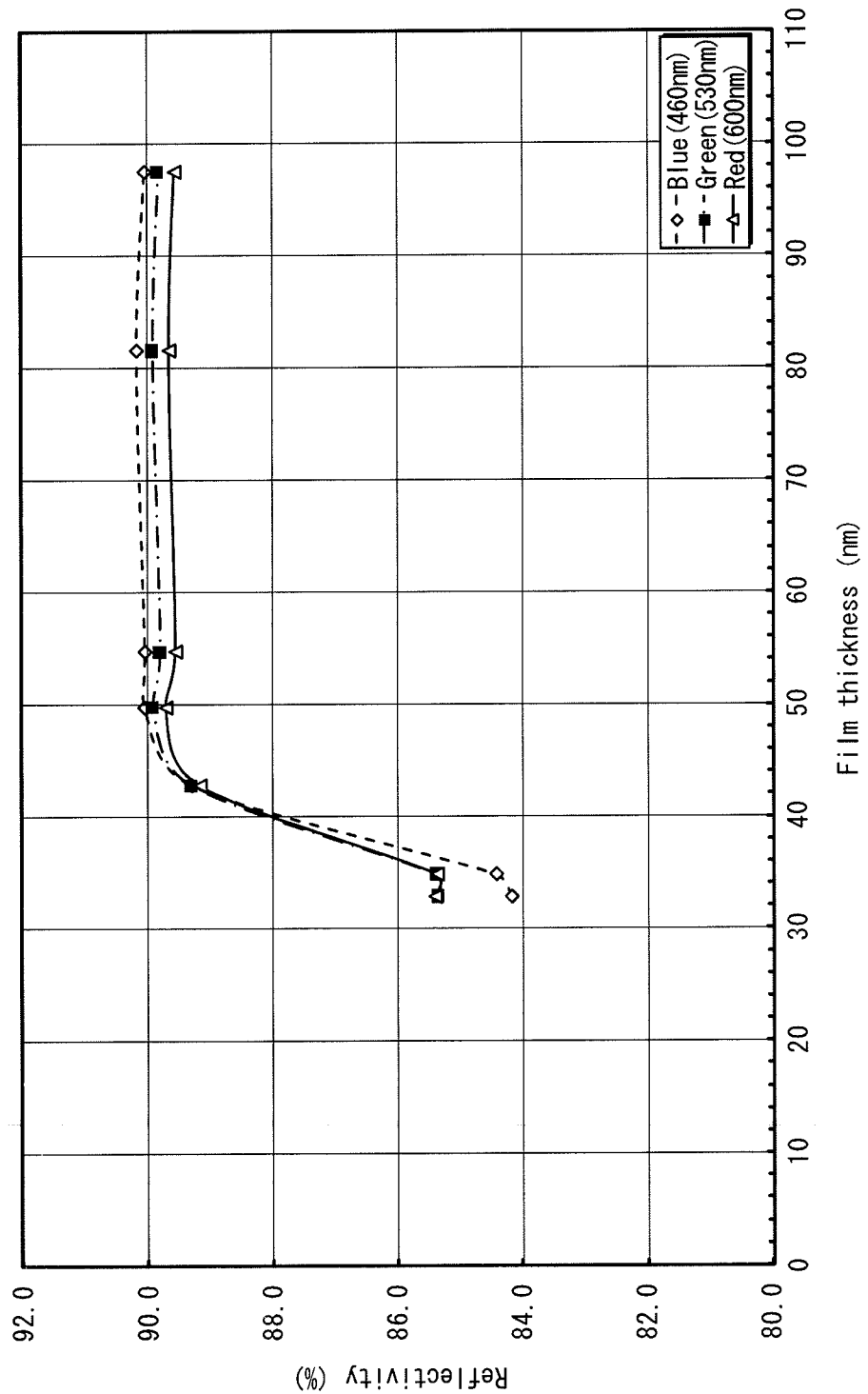
FIG. 7 is a diagram illustrating film thickness/reflectivity characteristics of the metal film 1031, for different luminescent colors.

In the following, description is provided on the effects achieved by providing the metal film 1031 included in the reflective electrode 103 with a film thickness of at least 43 nm, with reference to FIGS. 6 and 7. In FIG. 6, the horizontal axis indicates different wavelengths of measurement light emitted by a spectrophotometer used for measuring the reflectivity of measurement-target metal films, whereas the vertical axis indicates the reflectivity of the metal films. FIG. 7 is based on the measurement data illustrated in FIG. 6, and is a diagram illustrating a relationship between different film thicknesses of the metal films and the reflectivity of the metal films. In FIG. 7, the horizontal axis indicates the different film thicknesses of the metal films, whereas the vertical axis indicates the reflectivity of the metal films.

As illustrated in FIG. 6, metal films having a film thickness within the range of 43 nm to 98 nm exhibited a reflectivity equal to or higher than approximately 89% with respect to measurement wavelengths within a range of 450 nm to 600 nm.

In contrast, metal films having a film thickness of 33 nm and 35 nm exhibited a reflectivity of around 85% with respect to measurement wavelengths within the range of 450 nm to 600 nm.

Further, as illustrated in FIG. 7, metal films having a film thickness equal to or greater than 40 nm exhibited a reflectivity equal to or higher than 88% with respect to each of a measurement wavelength corresponding to red light (R: $\lambda$=600 nm), a measurement wavelength corresponding to green light G: $\lambda$=530 nm), and a measurement wavelength corresponding to blue light (B: $\lambda$=460 nm). Further, metal films having a film thickness equal to or greater than 43 nm exhibited a reflectivity equal to or higher than 89%, and metal films having a film thickness of equal to or greater than 50 nm exhibited a reflectivity of approximately 90% with respect to each of the above-described measurement wavelengths.

In addition, as illustrated in FIG. 7, metal films having a film thickness within a range of equal to or greater than 50 nm exhibited a reflectivity of approximately 90%, regardless to the difference in film thickness within the range, with respect to each of the above-described measurement wavelengths, namely the measurement wavelength corresponding to red light (R: $\lambda$=600 nm), the measurement wavelength corresponding to green light G: $\lambda$=530 nm), and the measurement wavelength corresponding to blue light (B: $\lambda$=460 nm).

In view of such results obtained from the measurement, in the display panel 10 pertaining to the present embodiment, the metal film 1031 included in the reflective electrode 103 is provided with a film thickness of at least 43 nm.

Note that, when considering only the reflectivity of the metal film 1031, there is no need of specifically setting a maximum of the film thickness of the metal film 1031, as can be seen from the results of the measurement. However, when taking into consideration that the reflective electrode 103 should be provided with as small a film thickness as possible to prevent the occurrence of the above-described problem of disconnection of the organic light-emitting layer 107, it is desirable to set the film thickness of the metal film 1031 to 200 nm or smaller, more desirably to 120 or smaller, and even more desirably, to 100 nm or smaller.

6. Method for Manufacturing Display Panel 10

In the following, description is provided on a method for manufacturing the display panel 10 pertaining to the present embodiment, with reference to FIGS. 8A through 8C to FIGS. 12A through 12C.

Figure 8:
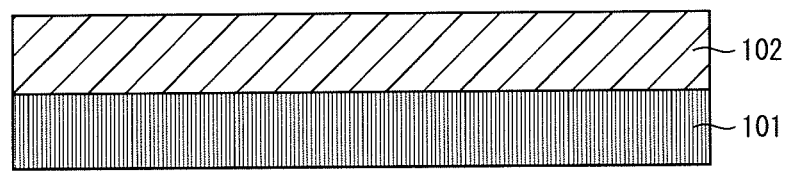
FIGS. 8A through 8C are schematic cross-sectional views sequentially illustrating different procedures in a manufacturing method of the display panel 10.
Figure 8:
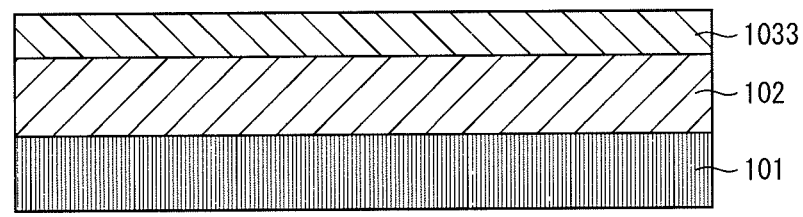
Figure 8:
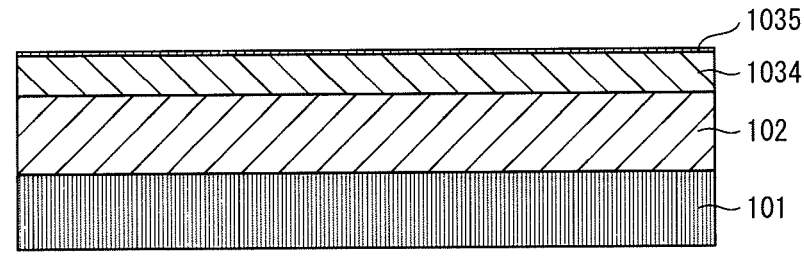

First, as illustrated in FIG. 8A, the substrate 101 is prepared, and an organic material having insulating property, such as polyimide resin, is applied onto the substrate 101. Then, baking is performed to form the interlayer insulating layer 102 on the substrate 101. Note that, although not illustrated in FIGS. 8A through 8C, etc., the TFT circuit, on the surface of which unevenness in level exists, is formed on the substrate 101. However, the interlayer insulating layer 102 has a planarized surface without unevenness in level.

Subsequently, as illustrated in FIG. 8B, a metal layer 1033 is formed on the interlayer insulating layer 102 so as to cover an upper surface of the interlayer insulating layer 102 entirely. The metal layer 1033 is a layer including Al as a main component. Then, as illustrated in FIG. 8C, a surface portion of the metal layer 1033 undergoes natural oxidation, and as a result, a combination of a metal layer 1034 and a metal oxide layer 1035 on the metal layer 1034 is formed.

Figure 9:
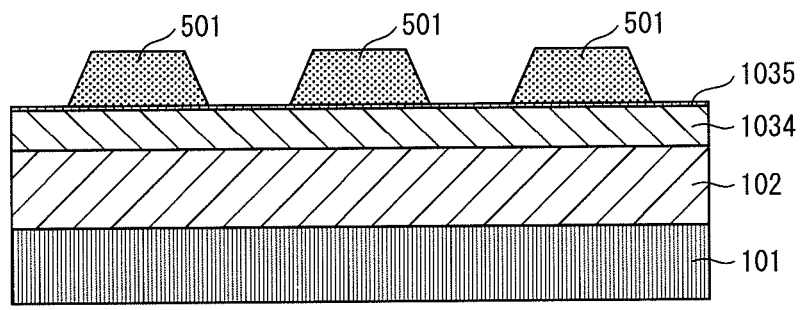
FIGS. 9A through 9C are schematic cross-sectional views sequentially illustrating different procedures in the manufacturing method of the display panel 10.
Figure 9:
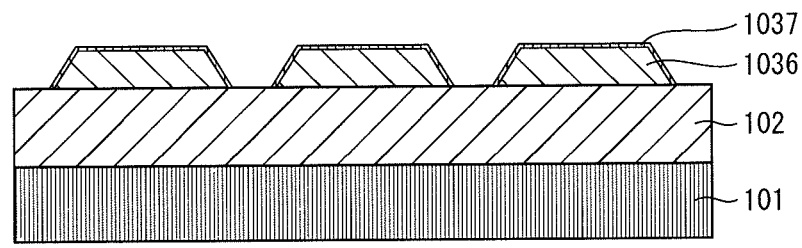
Figure 9:
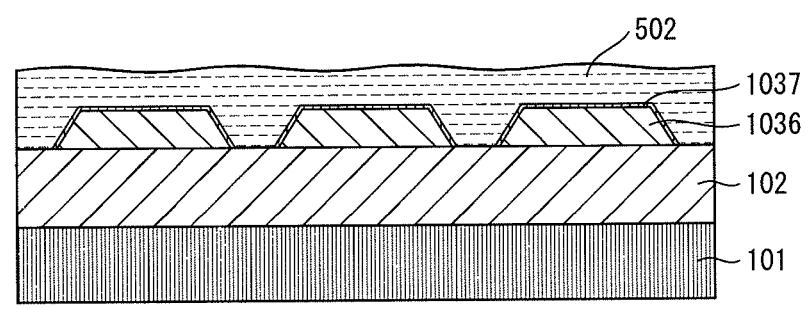

Next, as illustrated in FIG. 9A, a resist pattern 501 is formed so as to be layered on the metal oxide layer 1035. The resist pattern 501 is formed, for instance, by applying resist material onto an entire upper surface of the metal oxide layer 1035, and by performing exposure and developing by using a mask having a shape corresponding to the reflective electrode 103 (refer to FIG. 2). Subsequently, by performing etching by using the resist pattern 501 as a mask and then performing water rinsing and drying, a metal film 1036, which corresponds to the reflective electrode 103, is formed. Here, note that, during the above procedures of removing the resist pattern 501 and then performing water rinsing and drying, a metal oxide layer 1037 is formed on a surface portion of the metal film 1036, as illustrated in FIG. 9B.

Subsequently, by performing electroless plating processing, Ni is deposited onto the surface portion of the metal film 1036 while removing the metal oxide layer 1037 from the surface portion of the metal film 1036. In specific, as illustrated in FIG. 9C, the substrate 101 having the metal film 1036 formed thereabove is immersed in a plating solution 502. The plating solution 502 includes a component for dissolving and thereby removing the metal oxide layer 1037, which is an Al oxide layer, and a metal salt for supplying metallic Ni that is more noble than Al. In specific, HF or NH4F may be used, for instance, as the component for dissolving and thereby removing the metal oxide layer 1037, and nickel(II) acetate may be used, for instance, as the metal salt for supplying metallic Ni. Hence, as the plating solution 502, an aqueous solution can be used that is a mixture of the above-described component, the above-described metal salt, and a pH control agent (e.g., an ammonium hydroxide solution) for adjusting the solution environment such that replacement with Ni takes place in a stable manner.

Figure 10:
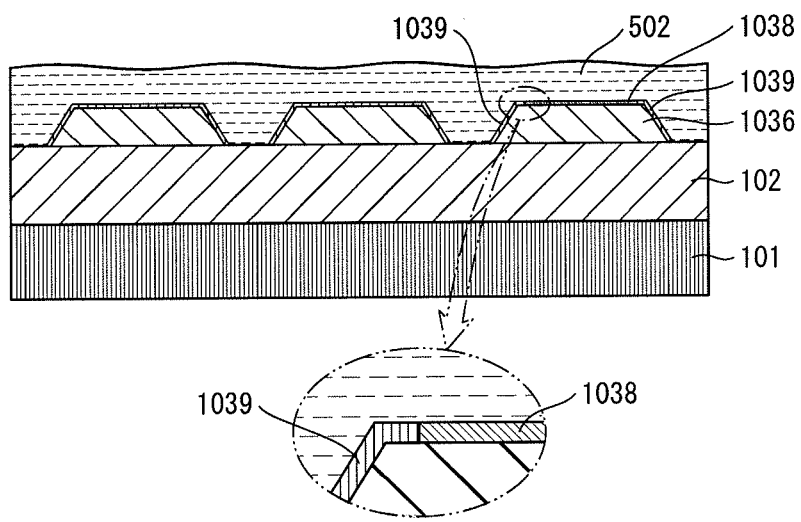
FIGS. 10A through 10C are schematic cross-sectional views sequentially illustrating different procedures in the manufacturing method of the display panel 10.
Figure 10:
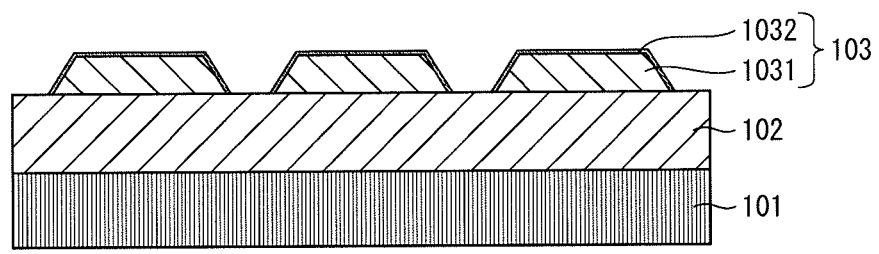
Figure 10:
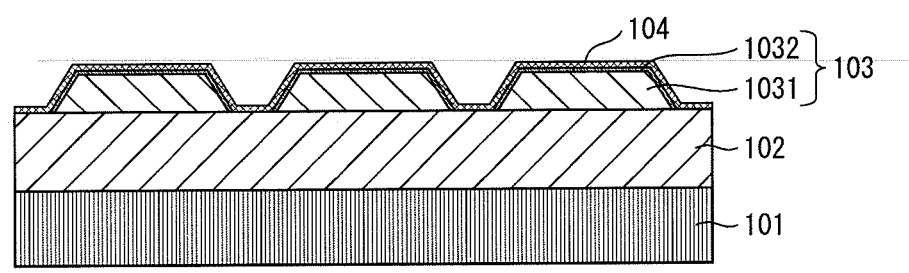

When performing the electroless plating processing by using the plating solution 502, after undergoing a state as illustrated in FIG. 10A where a portion of the metal oxide layer 1037 is replaced with a Ni film 1038 while the rest of the metal oxide layer 1037 remains as a metal oxide film 1039, the reflective electrode 103 is formed as illustrated in FIG. 10B by top and side surfaces of the metal film 1031 being covered by the Ni film 1032.

Among the two types of electroless processing, namely substitution-type electroless plating and reduction-type electroless plating, substitution-type electroless plating is more desirable in this case. This is since, when reduction-type electroless plating is performed, there are cases where a reducing agent used for performing reduction-type electroless plating remains as residue even after completion of plating. In such a case, device performance is affected by the residual reducing agent. Further, there are two types of substitution-type electroless plating, namely single-solution substitution-type electroless plating and double-solution substitution-type electroless plating. When performing single-solution substitution-type electroless plating, one solution (plating solution) is used, and the deposition of a metal (i.e., Ni) is performed at the same time as a metal oxide layer (i.e., the metal oxide layer 1037, which is an Al oxide layer) is removed. In contrast, when performing double-solution substitution-type electroless plating, the dissolution and removal of a metal oxide layer (i.e., the metal oxide layer 1037, which is an Al oxide layer) is first performed by using a first solution, and subsequently, the deposition of a metal (i.e., Ni) is performed by using a second solution. Here, note that the two types of substitution-type electroless plating described above, namely single-solution substitution-type electroless plating and double-solution substitution-type electroless plating, utilize the same mechanism. However, in this case, single-solution substitution-type electroless plating is more desirable for realizing simplification of processing procedures.

Subsequently, as illustrated in FIG. 10C, the charge injection layer 104 is formed on the surface of the reflective electrode 103 and the surface of the interlayer insulating layer 102 by sputtering or the like. In the present embodiment, the charge injection layer 104 is formed by using, for instance, an oxide such as an oxide of Ag, an oxide of Mo, an oxide of Cr, an oxide of V, an oxide of W, an oxide of Ni, and an oxide of Ir. Here, note that the charge injection layer 104 may also be formed such that a charge injection layer 104 for a given one of the pixels 100 of the display panel 10 is separated from a charge injection layer 104 for an adjacent one of the pixels 100.

Figure 11:
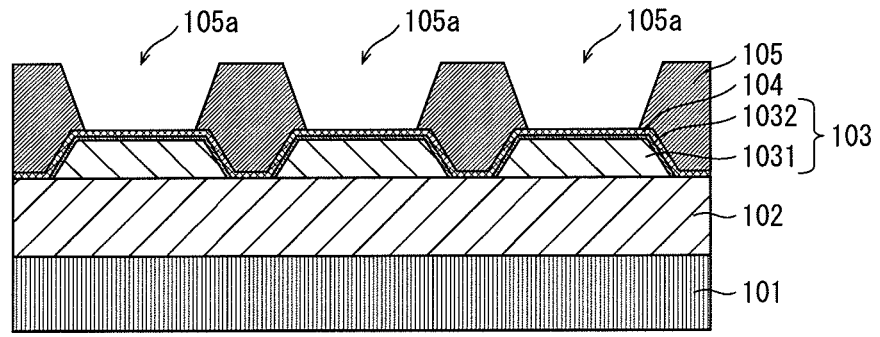
FIGS. 11A through 11C are schematic cross-sectional views sequentially illustrating different procedures in the manufacturing method of the display panel 10.
Figure 11:
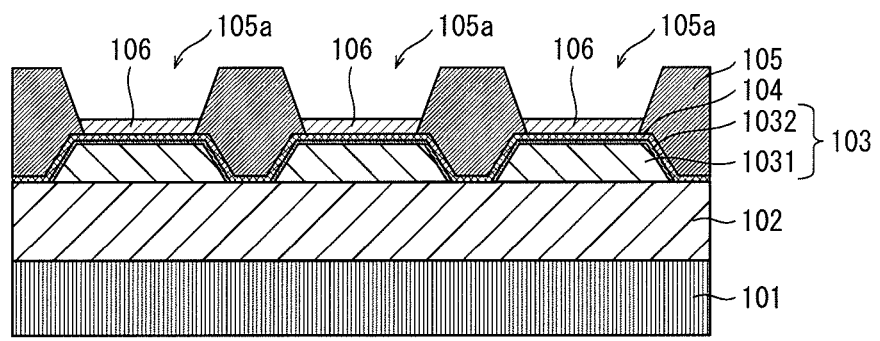
Figure 11:
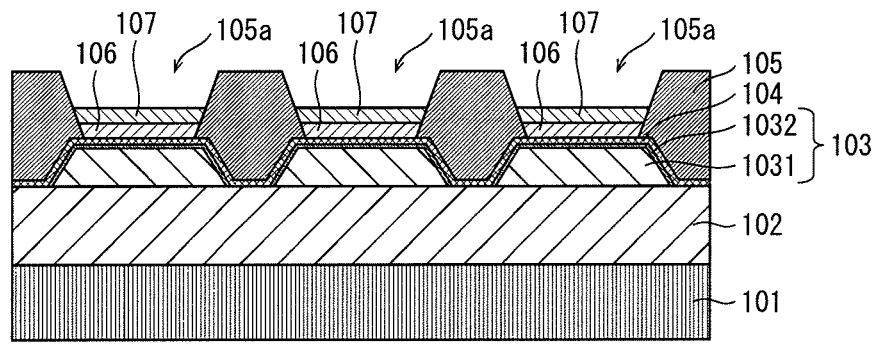

Following this, as illustrated in FIG. 11A, the bank 105 is formed. The bank 105 defines apertures 105a corresponding one-to-one with the pixels 100. The bank 105 is formed by first forming, by performing spin coating or the like, a bank material layer covering an entire upper surface of the charge injection layer 104. The forming of the bank material layer is performed by using a photoresist material. In specific, the bank material layer is formed by using an organic material having insulating property such as acrylic resin, polyimide resin, and novolac type phenolic resin, as already described above. Following the forming of the bank material layer, a mask corresponding to the apertures 105a is disposed onto the bank material layer, and exposure is performed. Further, by performing development and baking, the forming of the bank 105 is concluded.

Then, in each of the apertures 105a defined by the bank 105, the charge transport layer 106 is formed by ink including material for forming the charge transport layer 106 being applied, and drying of the ink being performed, as illustrated in FIG. 11B. Further, the organic light-emitting layer 107 is formed, within each of the apertures 105a defined by the bank 105, in a similar manner by application of ink including material for forming the organic light-emitting layer 107 and drying of the ink, as illustrated in FIG. 11C. In addition, the electron transport layer 108 is also formed, within each of the apertures 105a defined by the bank 105, in a similar manner by application of ink including material for forming the electron transport layer 108 and drying of the ink, as illustrated in FIG. 12A.

Figure 12:
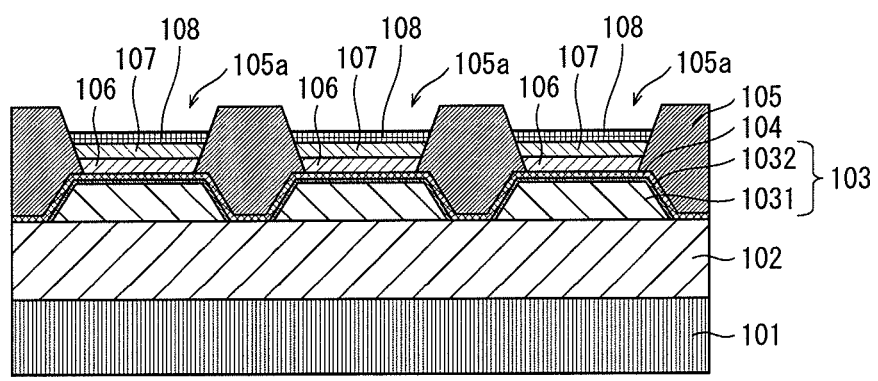
FIGS. 12A through 12C are schematic cross-sectional views sequentially illustrating different procedures in the manufacturing method of the display panel 10.
Figure 12:
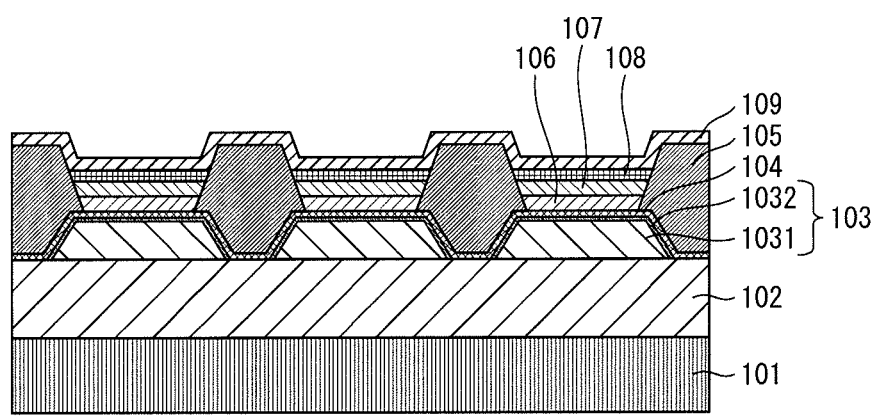
Figure 12:
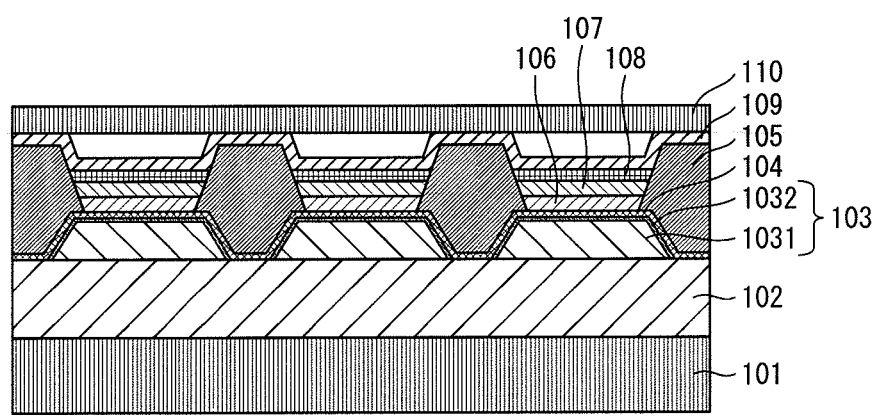

Successively, as illustrated in FIG. 12B, the transparent electrode 109 is formed on upper surfaces of the electron transport layer 108 and the bank 105 by sputtering or the like. Finally, as illustrated in FIG. 12C, the upper substrate 110 is mounted and adhered onto the transparent electrode 109. As a result of the upper substrate 110 being mounted and adhered onto the transport electrode 109, organic layers (i.e., the charge transport layer 106, the organic light-emitting layer 107, and the electron transport layer 108), formed in each of the apertures 105a, are protected from water, air, etc.

As such, the manufacturing of the display panel 10 is completed.

7. Replacement of Metal Oxide Layer 1037 with Ni Film 1032 Through Electroless Plating Processing In the following, description is provided on the replacement (or substitution) of the metal oxide layer 1037 (i.e., the Al oxide layer) with the Ni film 1032, which takes place through the electroless plating processing, with reference to FIGS. 13A through 13H. FIGS. 13A through 13D each correspond to a time point following a corresponding processing duration from the commencement of the electroless plating processing, and schematically illustrate a state of progress of the replacement of the metal oxide layer 1037 with the Ni film 1032 at the corresponding time point. Note that FIGS. 13A through 13D are arranged in chronological order. FIGS. 13E through 13H respectively correspond to FIGS. 13A through 13D, and each illustrate a surface state at the corresponding time point. More specifically, FIGS. 13A and 13E indicate a state before commencement of the electroless plating processing, FIGS. 13B and 13F indicate a state when the processing duration from the commencement of the electroless plating processing is 40 seconds, FIGS. 13C and 13G indicate a state when the processing duration from the commencement of the electroless plating processing is between 40 seconds to 50 seconds, and FIGS. 13D and 13H indicate a state when the processing duration from the commencement of the electroless plating processing has exceeded 50 seconds.

Figure 13:
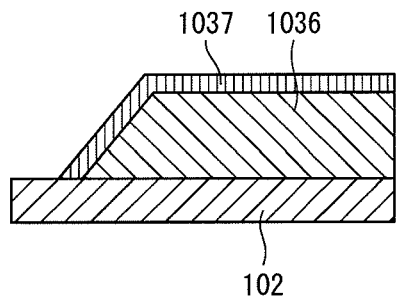
Figure 13:
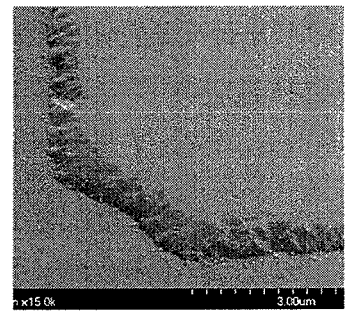
Figure 13:
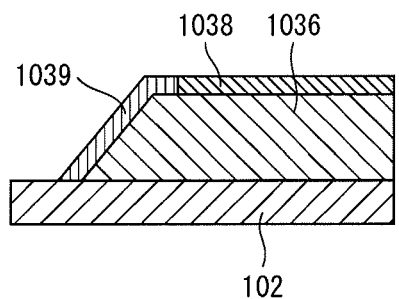
Figure 13:
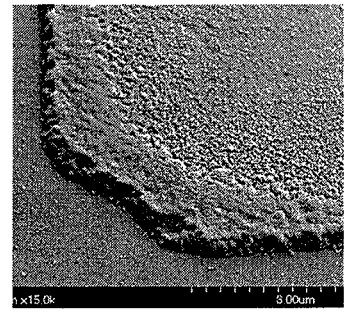
Figure 13:
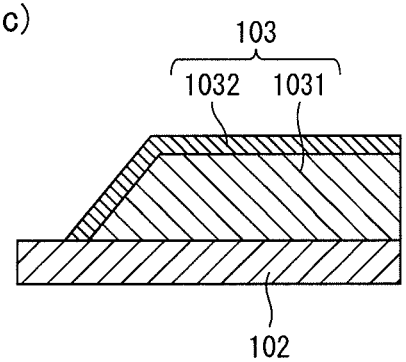
Figure 13:
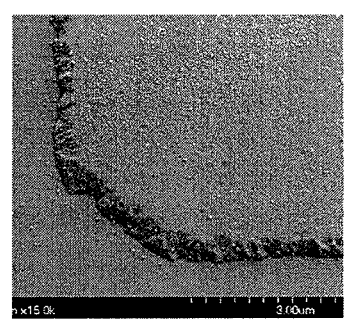
Figure 13:
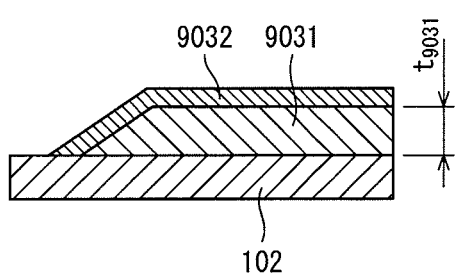
Figure 13:
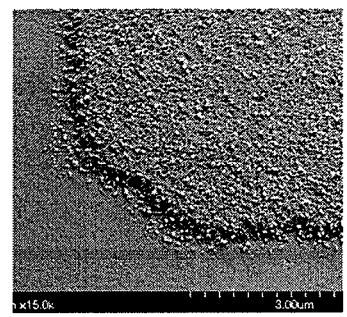

Before commencement of the electroless plating processing, the entire surface of the metal film 1036 is covered with the metal oxide layer 1037, as illustrated in FIG. 13A. The surface state at this point, corresponding to a state of the surface of the metal oxide layer 1037, exhibits planarity, as illustrated in FIG. 13E. In specific, the maximum height difference Rmax of the surface of the metal oxide layer 1037 illustrated in FIG. 13E is 4 nm to 5 nm, which indicates a substantially equivalent level of planarity as the surface of the metal film 1036, on which the metal oxide layer 1037 is formed.

When the electroless plating processing is commenced, a portion of the metal oxide layer 1037 is replaced with the Ni film 1038, as illustrated in FIG. 13B. Here, it should be noted that there are cases where a portion of the metal oxide layer 1037 remains without being replaced with the Ni film 1038. Such a portion corresponds to the metal oxide film 1039. Here, as illustrated in FIG. 13F, at the point in processing where the electroless plating processing is commenced and the forming of the Ni film 1038 has begun, the surface roughness of a portion where the Ni film 1038 is being formed increases compared to at the point illustrated in FIG. 13E where the electroless plating processing is not commenced yet. The following provides a possible reason as to why such an increase in surface roughness is observed. That is, since the Ni film 1038 is a thin film (having a film thickness d satisfying: $0\ nm < d < 5\ nm$), the planarity of the surface of the Ni film 1038 changes in accordance with the planarity of the surface of the metal film 1036. As such, while the melting out of the metal oxide layer 1037 is taking place, Al melts out from the metal film 1036 in reaction to the pH control agent contained in the plating solution 502, and the surface roughness of the metal film 1036 increases, which in turn brings about an increase in the surface roughness of the Ni film 1038.

When the electroless plating processing is performed for a longer processing duration, a side edge portion (the tapered portion in FIG. 13C) of the metal film 1031 is also covered by the Ni film 1032, as illustrated in FIG. 13C. At this point in processing, the surface of the reflective electrode 103 becomes flat and smooth as illustrated in FIG. 13G since the amount of Al melting out from the metal film 1031 is balanced with the amount of Ni deposited onto the surface of the metal film 1031. In specific, according to the present embodiment, the average roughness Ra of the surface of the reflective electrode 103 satisfies: $0.6\ nm \leq Ra < 2.0\ nm$, and the maximum height difference Rmax of the surface of the reflective electrode 103 satisfies: 5 nm≤Rmax<20 nm.

FIG. 13D illustrates a case where the electroless plating processing is continued even after the state illustrated in FIGS. 13C and 13G is reached. As illustrated in FIG. 13D, when the electroless plating processing is continued after the state illustrated in FIG. 13C is reached, due to the melting out of Al from the metal film 1031 progressing to a further extent, a film thickness $t_{9031}$ of a remaining metal film 9031 decreases and falls below 43 nm. In addition, as illustrated in FIG. 13H, surface roughness increases due to the melting out of Al from the metal film 1031 progressing to a further extent. Here, it should be noted that, when a thickness d of a Ni film 9032 exceeds 5 nm, incident light is reflected by the surface of the Ni film 9032. The reflectivity of the Ni film 9032 is 41.2% at a wavelength of 361 nm, and 68.8% at a wavelength of 700 nm, and therefore, is lower than the reflectivity of the metal film 9031, which is an Al film.

Further, note that when the Ni film (i.e., the Ni films 1038 and 1032) is formed through replacement as illustrated in FIGS. 13B and 13C, the Ni film (i.e., the Ni films 1038 and 1032) is layered with respect to the metal film (i.e., the metal films 1036 and 1031) without interposition of an Al oxide layer that covers an entirety of the surface of the metal film (i.e., the metal films 1036 and 1031) onto which the Ni film (i.e., the Ni films 1038 and 1032) is layered.

In addition, Ni has lower ionization tendency compared to Al, and does not easily oxidize when exposed to air and does not easily interact with water. Due to this, natural oxidation of the Ni film 1032 does not take place easily, and further, the oxidation of Al included in the metal layer 1031 is also prevented by the metal layer 1031 being covered by the Ni film 1032. As such, by the natural formation of a Ni oxide layer on the surface of the Ni film 1032 and the natural formation of an Al oxide layer on the surface of the metal film 1031 being prevented, the loss occurring due to light being absorbed within natural oxide layers is suppressed.

Further, since the Ni film 1032 is formed to have a film thickness that is far thinner than visible wavelengths, visible light reaches the metal film 1031 without being absorbed within the Ni film 1032, and is then reflected at the surface of the metal film 1031. Here, since a natural oxide layer does not exist on the surface of the metal film 1031, or that is, since a natural oxide layer does not exist at an interface between the metal film 1031 and the Ni film 1032, the metal film 1031 is able to fully exhibit the high reflectivity intrinsically possessed by metals.

As description has been provided up to this point, by layering the Ni film 1032 onto the surface of the metal film 1031 without interposition of a natural oxide layer therebetween, the forming of a natural oxide layer is prevented with a high degree of certainty, and in addition, the absorption of light in the Ni film 1032 is prevented. Due to this, the metal film 1031 exhibits high reflectivity that is intrinsically possessed by Al included therein, and hence, the reflective electrode 103 achieves high reflectivity.

Note that, according to the description provided above, it can be seen that 40 seconds to 50 seconds is desirable as the processing duration from the commencement of the electroless plating processing to the completion of the electroless plating processing. As such, a processing duration of, for instance, 45 seconds is considered to be desirable.

8. Observations Concerning Application of Electroless Plating Processing

In the present embodiment, the electroless plating processing is performed for forming the reflective electrode 103. In the following, the reasons are provided for which the electroless plating processing has been selected as the method for forming the reflective electrode 103, with reference to comparative examples illustrated in FIGS. 14A through 14C. The comparative examples illustrated in FIGS. 14A through 14C are examples where reflective electrodes are formed by patterning metal films formed by sputtering, vapor deposition, etc.

Figure 14:
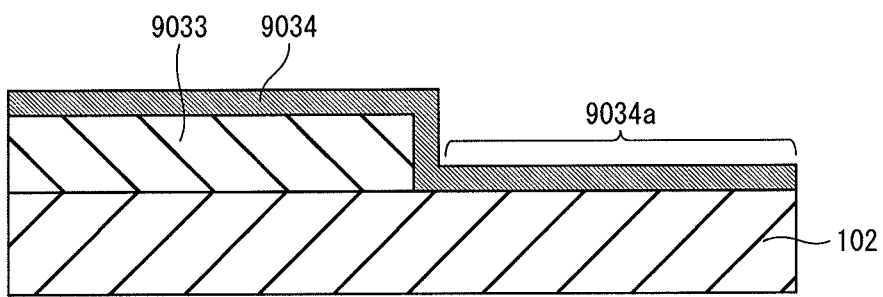
FIGS. 14A through 14C are schematic cross-sectional views illustrating reflective electrodes formed as comparative examples by performing sputtering, vapor deposition, etc.
Figure 14:
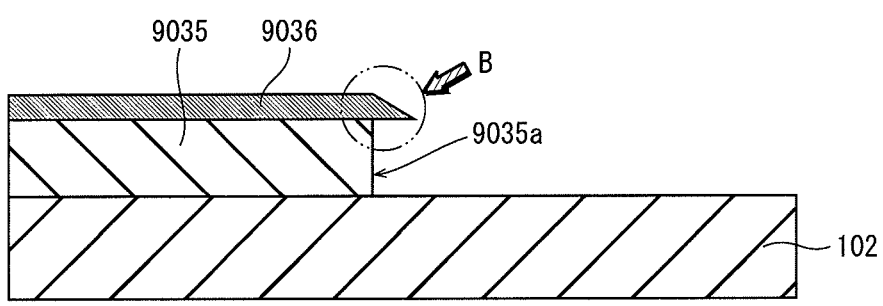
Figure 14:
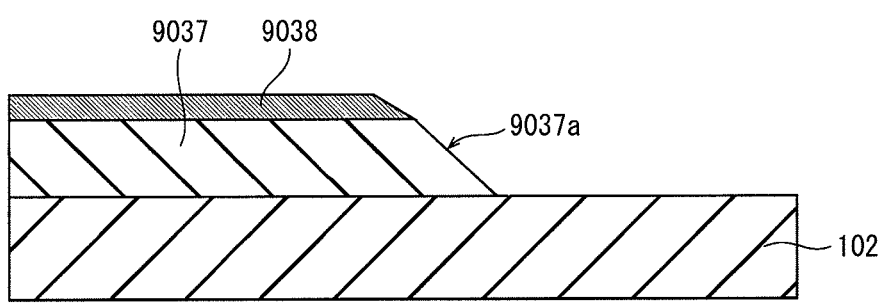

First, description is provided on the comparative example illustrated in FIG. 14A. In the comparative example illustrated in FIG. 14A, an Al film 9033 is formed on the interlayer insulating layer 102 by performing sputtering or vapor deposition, and then performing patterning by etching. Further, a Ni film 9034 is formed on the Al film 9033. When a reflective electrode is formed according to such a method, the Ni film 9034 is also formed so as to cover an area (an area 9034a in FIG. 14A) that is not above the Al film 9033.

Next, description is provided on the comparative example illustrated in FIG. 14B. In the comparative example illustrated in FIG. 14B, an Al film and a Ni film are formed in the stated order by sputtering or vapor deposition. Then, patterning is performed by etching both the Al film and the Ni film at the same time. During this etching, a side portion (an area 9035a in FIG. 14B) of an Al film 9035 is etched (hereinafter referred to as "side-etching"), and as a result, a Ni film 9036 that has an area having the shape of an eave (an area B in FIG. 14B) is formed.

Finally, description is provided on the comparative example illustrated in FIG. 14C. In the comparative example illustrated in FIG. 14C, based on the comparative example illustrated in FIG. 14B, adjustment is performed of the etching conditions and processing methods. Due to this, side-etching is suppressed compared to the case illustrated in FIG. 14B, but however, a resultant Ni film 9038 formed on an Al film 9037 does not cover a side face portion 9037a of the Al film 9037.

When, as in the three comparative examples described above, an Al film (i.e., the Al films 9033, 9035, and 9037) and a Ni film (i.e., the Ni films 9034, 9036, and 9038) are formed by first performing sputtering or vapor deposition, and then performing etching, the reflective electrode formed as a result does not have characteristics as excellent as those exhibited by the reflective electrode 103 in the display panel 10 pertaining to the present embodiment. In specific, when a reflective electrode is formed as in the comparative example illustrated in FIG. 14A, a separate processing of removing the area 9034a is additionally required. Further, when a reflective electrode is formed as in the comparative example illustrated in FIG. 14B, due to the area 9035a formed as a result of the side-etching, there is a risk of problems occurring in the subsequent procedures where other layers are formed thereon. Due to this, a reduction in yield is expected to take place. Finally, when a reflective electrode is formed as in the comparative example illustrated in FIG. 14C, the Ni film 9038 is not layered so as to cover the side face portion 9037a. As such, the transportation of charges from the reflective electrode to be formed falls smaller than desired, and as a result, light-emitting efficiency of the resulting display panel is impaired.

9. Processing Duration of Electroless Plating and Metal Film 1031

Figure 15:
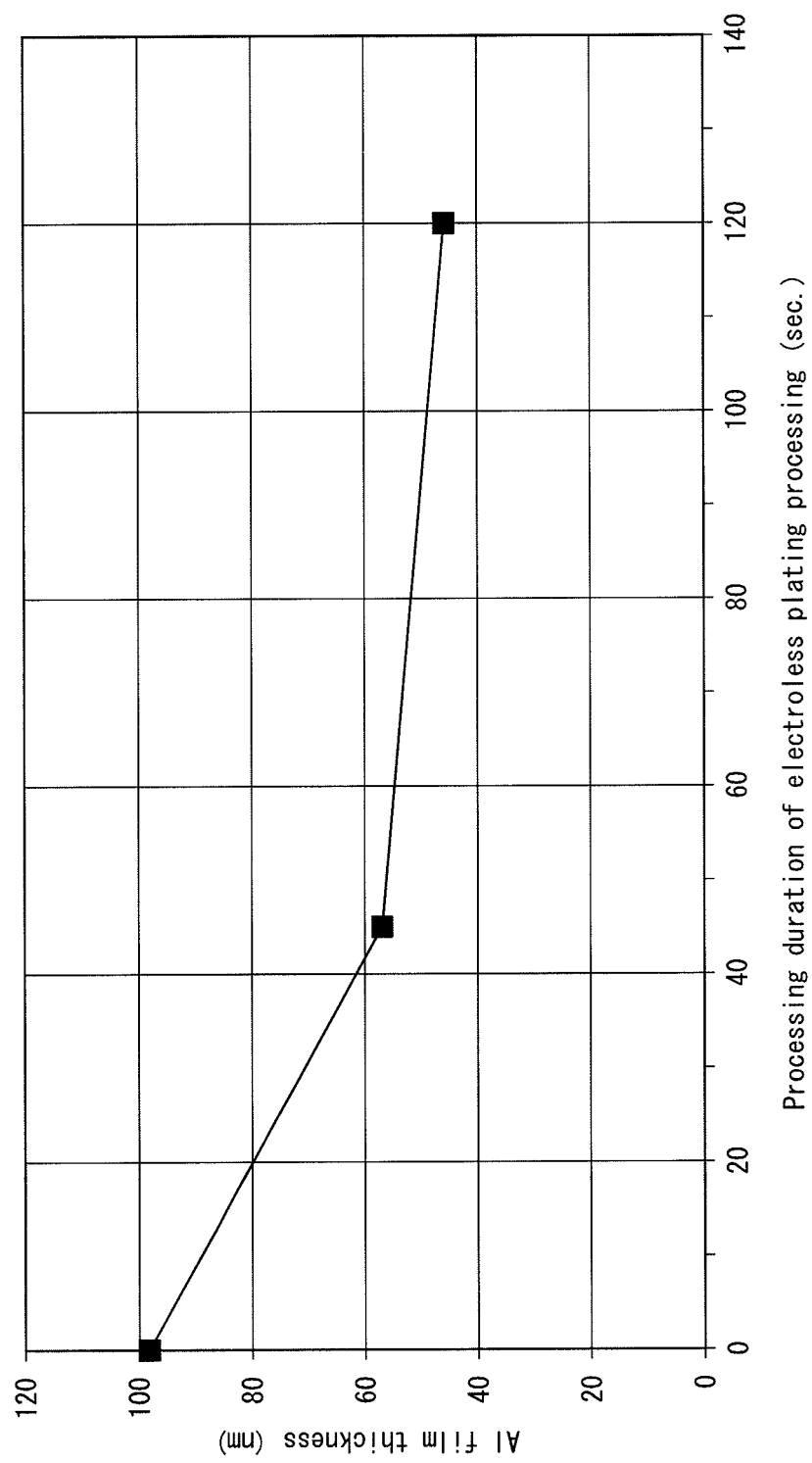
FIG. 15 is a characteristic diagram illustrating a relationship between different processing durations of the electroless plating processing and film thicknesses of a metal film (Al film).

In the following, description is provided on the relationship between the processing duration for which the electroless plating processing is performed and the film thickness of the metal film 1031, with reference to FIG. 15.

When forming the Ni film 1032 by replacement through the electroless plating processing, Al melts out from the metal film 1031, which is the baselayer onto which the Ni film 1032 is formed. Due to this, as illustrated in FIG. 15, from the commencement of the electroless plating processing to a point where the processing duration reaches 45 seconds, the film thickness of the metal film (the Al film) decreases rapidly, and after the processing duration from the commencement of the electroless plating processing reaches 45 seconds, the film thickness of the metal film (the Al film) decreases moderately. This is due to the following mechanism.

Generally speaking, a natural oxide layer formed on a surface of a metal film (an Al film) can be dissolved and thereby removed by using an acid solution or an alkaline solution. In addition, a plating solution used for performing Ni plating with respect to a metal film (an Al film) contains a pH control agent. As such, even after the dissolution and removal of an Al natural oxide layer formed on the metal film is completed, Al continues to melt out from the metal film little by little due to an acid solution or an alkaline solution being contained in the plating solution.

Further, as already described above, so as to ensure that the metal film 1031 is provided with a sufficient level of reflectivity, it is desirable to provide the metal film 1031 with a film thickness of at least 43 nm. According to FIG. 15, when the processing duration for which the electroless plating processing is performed is within 120 seconds, the metal film 1031 can be provided with a film thickness within the permissible range of equal to or greater than 43 nm.

Figure 16:
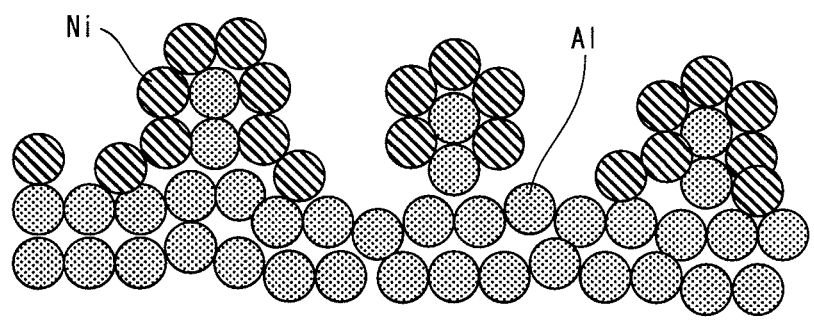
FIG. 16A is a schematic cross-sectional diagram of a Ni film formed by performing the electroless plating processing.
FIG. 16B is a characteristic diagram illustrating a relationship between different processing durations of the electroless plating processing and a surface roughness indicated by Rmax and Ra.
Figure 16:
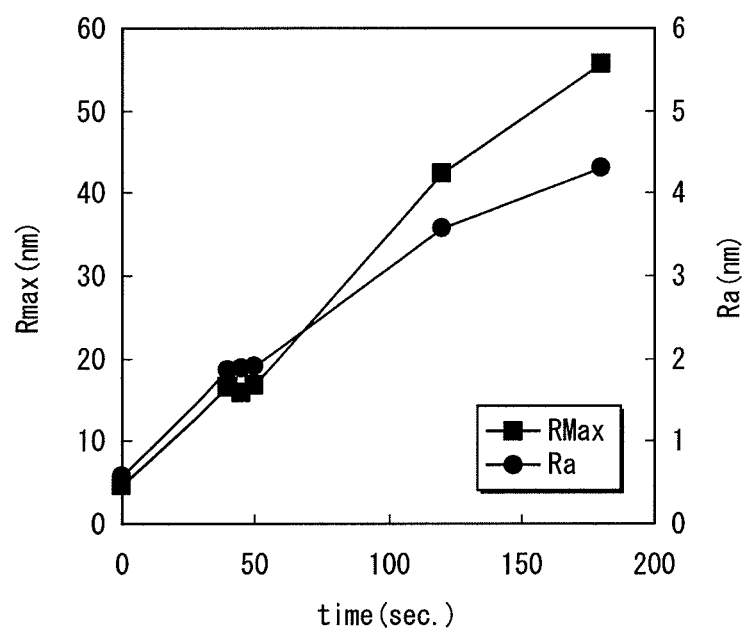

Subsequently, description is provided on the relationship between the processing duration for which the electroless plating processing is performed and the surface roughness of a resultant reflective electrode indicated by Ra and Rmax, with reference to FIGS. 16A and 16B. Here, note that the data presented in FIG. 16B is obtained by performing measurement by using an atomic force microscope (AFM). In specific, measurement has been performed of the average roughness Ra and the maximum height difference Rmax within a 10 μm×10 μm area on a surface of a measurement-target reflective electrode by using an AFM.

First of all, in the electroless plating processing, the natural oxide layer (i.e., the natural oxide layer 1037/1039) on the surface of the metal film 1036 (the Al film) is dissolved and thereby removed, and then, Ni is deposited onto Al by making use of the difference in ionization tendencies between Al and Ni (FIG. 16A). As such, when the electroless plating processing is utilized, the Ni film (i.e., the Ni film 1038/1032) is formed so as to have an extremely small film thickness. In specific, Ni is deposited onto the surface of the metal film 1036 due to the difference in oxidation-reduction potentials of Ni and Al. It is since Ni is a metal that is more noble compared to Al (i.e., Ni is a metal having a smaller ionization tendency than Al) that Ni is deposited on Al. Further, Ni is able to interact with surface areas at which Al, which is a metal that is less noble compared to Ni (i.e., Al is a metal having a greater ionization tendency than Ni), is exposed. As such, Ni is not deposited onto organic layers or oxide films.

In addition, once Ni is deposited onto the surface of the metal film 1036, the difference in oxidation-reduction potentials equals zero. As such, further deposition of Ni onto Ni having been previously deposited does not take place. Therefore, it is ensured that the film thickness of the Ni film 1032 does not become greater than permissible.

As described above, Ni is not deposited onto a portion onto which Ni has already been deposited. As such, the deposition of Ni occurs only at a portion where Al is exposed as a result of the natural oxide layer having been removed. Due to this, during the electroless plating processing, on the surface of the metal film 1036, there are portions where Ni has been deposited while there are other portions where Al is still exposed and Ni is to be deposited thereon.

As illustrated in FIG. 16B, as the electroless plating processing progresses, both the average roughness Ra and the maximum height difference Rmax indicate an increase. Here, it is desirable that the average roughness Ra of the surface of the reflective electrode 103 to be formed satisfy: 0.6 nm≤Ra<2.0 nm, and the maximum height difference Rmax of the surface of the reflective electrode 103 to be formed satisfy: 5 nm≤Rmax<20 nm. Such conditions are defined based on the relationship between the film thickness and the reflectivity of the reflective electrode 103. Detailed description on this relationship is provided in the following.

As illustrated in FIG. 16B, the average roughness Ra of a surface of a sample Al film before commencement of the electroless plating processing indicated an initial value between 0.5 nm to 0.6 nm. The average roughness Ra of surfaces of sample Al films corresponding to processing durations of 40 seconds, 45 seconds, and 50 seconds satisfied: Ra<2.0 nm, and the average roughness Ra of surfaces of sample Al films corresponding to processing durations of longer than 50 seconds satisfied: Ra>2.0 nm.

As for the minimum values of the average roughness Ra and maximum height difference Rmax, the minimum values correspond to the average roughness Ra and the maximum height difference Rmax of a sample Al film before commencement of the electroless plating processing, provided that Al natural oxide films formed on the sample Al film before commencement of the electroless plating processing can be removed uniformly. As description has been provided above, the reflective electrode 103 is to be formed so that the surface thereof has a high degree of planarity, or that is, so that the average roughness Ra and the maximum height difference Rmax of the surface thereof respectively satisfy: Ra<0.6 nm and Rmax<5 nm. The forming of the reflective electrode 103 is performed in such a manner since the film thickness of the organic light-emitting layer 107 is extremely thin, being in a range from 20 nm to 200 nm, and therefore, there is a need to prevent the occurrence of a short circuit between the reflective electrode 103 and the transparent electrode 109, which is provided opposite the reflective electrode 103. So as to ensure that the reflective electrode 103 is formed to have a high degree of planarity as described above, the film-forming conditions when forming the reflective electrode 103 are optimized by performing polishing, acid treatment, sputtering or the like.

As description has been provided above, natural oxide films are formed on the surfaces of the sample Al films. However, since such natural oxide films have a film thickness in the order of few nanometers, the planarity of the surfaces of such natural oxide films formed on the surfaces of the sample Al films are substantially equivalent to the planarity of the surfaces of the sample Al films. As such, although in most cases, measurement of the average roughness Ra and the maximum height difference Rmax of surfaces of Al films is actually performed by measuring the surfaces of natural oxide films formed on the measurement-target Al films, it can be assumed that the average roughness Ra and the maximum height difference Rmax of the surfaces of the natural oxide films are substantially equivalent to the average roughness Ra and the maximum height difference Rmax of the surfaces of the Al films on which the natural oxide films are formed.

Figure 17:
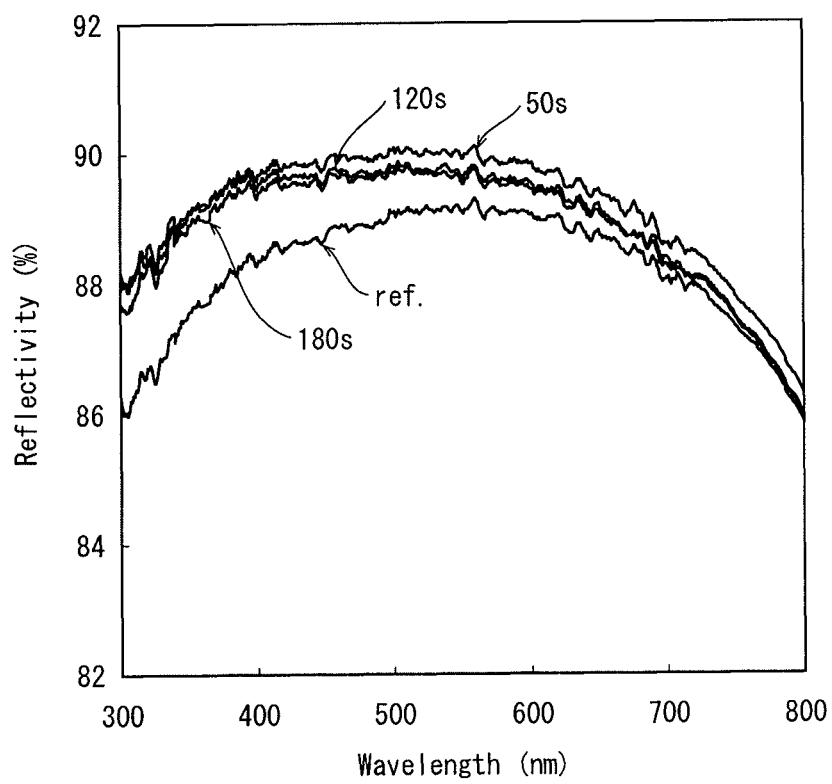
FIG. 17 is a diagram illustrating a wavelength/reflectivity relationship, for different processing durations of the electroless plating processing.

In the following, description is provided on the relationship between the processing duration for which the electroless plating processing is performed and the reflectivity of a resultant reflective electrode, with reference to FIG. 17. FIG. 17 is a diagram illustrating a wavelength/reflectivity relationship, for different processing durations of the electroless plating processing. Note that, in FIG. 17, "ref." indicates a sample before commencement of the electroless plating processing, or that is, a sample metal film having a surface covered with a metal oxide layer. In addition, in FIG. 17, illustration is not provided of data of a sample metal film corresponding to the processing duration of 40 seconds and a sample metal film corresponding to the processing duration of 45 seconds. This is since, such sample metal films indicated the same results as a sample metal film corresponding to the processing duration of 50 seconds, illustration of which is provided in FIG. 17.

As illustrated in FIG. 17, the sample metal film having a surface covered with a metal oxide layer exhibited the lowest reflectivity over the entire measurement wavelength. For instance, when focusing on red light (corresponding to the measurement wavelength of 600 nm), the "ref." sample having a surface covered with the metal oxide layer exhibited a reflectivity of approximately 89%. In contrast, the sample metal film corresponding to the processing duration of 50 seconds exhibited a high reflectivity of approximately 90% with respect to red light.

In addition, the sample metal films corresponding to the processing durations of 120 seconds and 180 seconds each exhibited a lower reflectivity compared to the sample metal film corresponding to the processing duration of 50 seconds. From this, it could be seen that, the longer the processing duration of the electroless plating processing, the lower the reflectivity exhibited by the resultant sample metal film. This is assumed to be a result of the amount of Al melting out from the metal film, which serves as a baselayer, increasing as the processing duration of the electroless plating processing is extended, and consequently, the roughness and unevenness of the surface of the metal film increasing. That is, it is assumed that, as the melting out of Al from the metal film progresses, the average roughness Ra and the maximum height difference Rmax, which indicate the roughness of the surface of the metal film, increase, and accordingly, the reflectivity of the metal film decreases due to irregular reflection occurring at the surface of the metal film.

As illustrated in FIG. 17, the measurement results for green light (corresponding to the measurement wavelength of 530 nm) and blue light (corresponding to the measurement wavelength of 460 nm) were similar to the above-described measurement results for red light.

According to the above, since dissolution of an Al natural oxide layer and replacement with a Ni film take places, it is desirable to set the processing duration of the electroless plating processing such that the average roughness Ra and the maximum height difference Rmax of a surface of the metal film, which results from Al melting out from the metal film, satisfies the respective conditions presented below. More specifically, the processing duration of the electroless plating processing is to be set within a range of 40 seconds to 50 seconds.

$$0.6 \text{ nm} \leq Ra < 2.0 \text{ nm} \qquad \text{[Math 1.]}$$

$$5 \text{ nm} \leq Rmax < 20 \text{ nm} \qquad \text{[Math 2.]}$$

Here, it should be noted that natural fluctuation is expected to be observed when the electroless plating processing is performed. In specific, within the range of Rmax<20 nm, the value Rmax may fluctuate by about ±10% to ±20%. Due to this, it is desirable that the maximum of Rmax be set within a range of 15 to 20 nm. By performing the electroless plating processing such that Rmax satisfies [Math. 2] above, manufacture of a device can be stably performed while ensuring high yield.

In contrast, when the electroless plating processing is continued until Rmax satisfies: Rmax≥20 nm, the realization of a stable manufacturing process becomes difficult. In addition, when the electroless plating processing is continued until such a point, the surface roughness of a resultant reflective electrode exceeds the film thickness of the organic layers. As a result, a short circuit may occur between the reflective electrode and a transparent electrode opposite the reflective electrode. As such, device characteristics may be impaired.

Further, when the processing duration of the electroless plating processing is within a range of 40 seconds to 50 seconds, the amount of dissolution of an Al natural oxide layer on a surface of a metal film and the amount of Ni deposited onto the surface of the metal film becomes balanced. Due to this, the maximum height difference of the surface of a resulting reflective electrode satisfies: 5 nm≤Rmax<17 nm with a high degree of certainty. Hence, it is further desirable that the maximum height difference Rmax satisfy the following condition.

$$5 \text{ nm} \leq Rmax < 17 \text{ nm} \qquad \text{[Math 3.]}$$

10. Relationship Between Reflection Electrode 103 and Bank 105 As illustrated in FIG. 2, in the display panel 10 pertaining to the present embodiment, an upper portion (i.e., an upper portion in the Z-axis direction in FIG. 2) of each end portion of the reflective electrode 103 (i.e., both end portions of the reflective electrode 103 in the X-axis direction in FIG. 2) is covered by the bank 105. In the following, description is provided on the effects achieved by providing the display panel 10 with such a structure through comparison with the comparative examples illustrated in FIGS. 18A and 18B.

Figure 18:
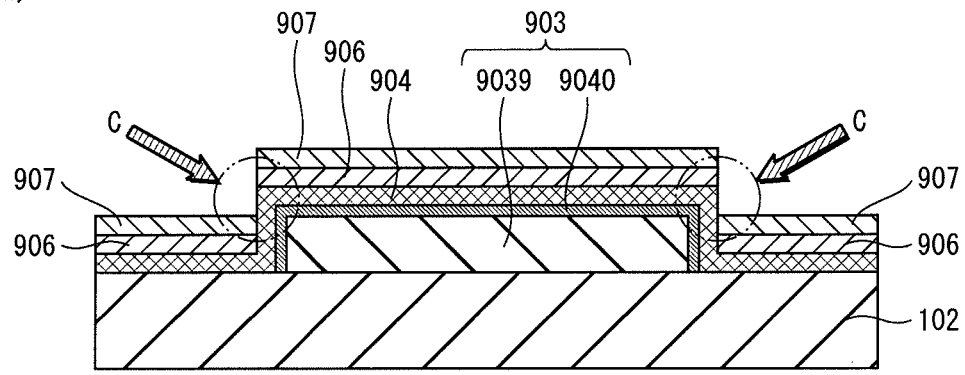
FIG. 18A is a schematic cross-sectional diagram illustrating a structure of a reflective electrode 903 pertaining to a comparative example.
FIG. 18B is a schematic cross-sectional diagram illustrating a structure of a reflective electrode 913 pertaining to a comparative example.
Figure 18:
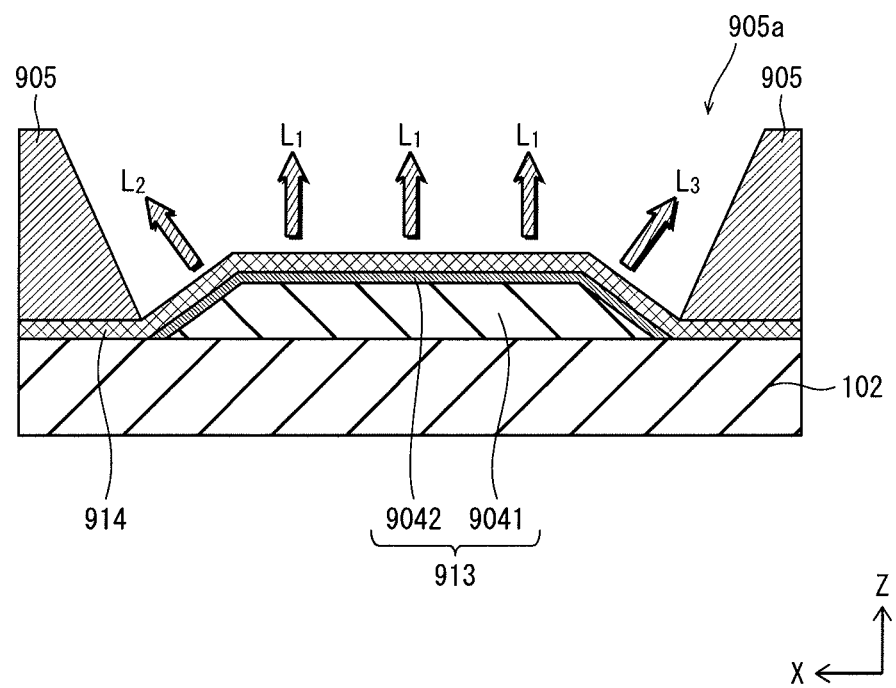

First, description is provided on the comparative example illustrated in FIG. 18A. In the comparative example illustrated in FIG. 18A, side walls of a metal film 9039 included in a reflective electrode 903 are perpendicular to the surface of the interlayer insulating layer 102. In such a case, side walls of a Ni film 9040 to be formed so as to cover the metal film 9039 also becomes perpendicular to the surface of the interlayer insulating layer 102. Further, in the comparative example illustrated in FIG. 18A, the reflective electrode 903 has a structure where end portions thereof are not covered by a bank. As such, when forming a charge injection layer 904 on the reflective electrode 903 from a metal oxide film, the charge injection layer 904 is formed so as to cover side surfaces of the reflective electrode 903 in addition to a top surface of the reflective electrode 903. However, when subsequently forming a charge transport layer 906 and an organic light-emitting layer 907, which correspond to organic layers, the charge transport layer 906 and the organic light-emitting layer 907 do not cover the side surfaces of the reflective electrode 903, or that is, the charge transport layer 906 and the organic light-emitting layer 907 are formed so as to be discontinuous at end portions of the reflective electrode 903, as indicated by the arrows C. As such, when a reflective electrode is formed as in the comparative example illustrated in FIG. 18A, there is a risk of a short circuit occurring between a transparent layer to be subsequently formed above the organic light-emitting layer 907 and the charge injection layer 904 or the reflective electrode 903.

Further, in the above-described case, even if a short circuit does not occur, there is a risk of electric field concentration occurring in the periphery of the end portions of the reflective electrode 903.

Next, description is provided on the comparative example illustrated in FIG. 18B. In the comparative example illustrated in FIG. 18B, each end portion of a metal film 9041 included in a reflective electrode 913 is formed in the shape of a slope, and further, a Ni film 9042 formed on the metal film 9041 is provided with a shape that is in accordance with the shape of the metal film 9041. Such a structure is advantageous, particularly in that each of apertures 905a defined by a bank 905 can be provided with a relatively large size. However, when a reflective electrode is formed as in the comparative example illustrated in FIG. 18B where the bank 905 does not cover upper surface of both end portions of the reflective electrode 913, among light components $L_1$, $L_2$, and $L_3$ reflected by a surface portion of the metal layer 9041, the light components $L_2$ and $L_3$ are diffused by irregular reflection occurring at the sloped end portions of the reflective electrode 913.

In comparison to the comparative examples provided above, the reflective electrode 103 pertaining to the present embodiment is formed so as to have end portions each having a shape of a slope, and further, the upper surfaces of the end portions are covered by the bank. Due to this, in the display panel 10 pertaining to the present embodiment, it is ensured that the organic light-emitting layer 107 and the like, which are organic layers, are formed without disconnection above the end portions. In addition, problems such as electric field concentration are prevented from occurring at the end portions of the reflective electrode 103. As such, the display panel 10 pertaining to the present embodiment realizes longevity.

Further, the reflective electrode 103 pertaining to the present embodiment has a structure where at least upper surfaces of both end portions thereof in the X-axis direction in FIG. 2 are covered by the bank 105. As such, the display panel 10 pertaining to the present embodiment realizes excellent display quality due to irregular reflection not occurring therein.

[Embodiment 2]

In the following, description is provided on a structure of a display panel 30 pertaining to embodiment 2 of the present invention, with reference to FIG. 19. Note that, in FIG. 19, elements similar to those included in the display panel 10 pertaining to embodiment 1 are provided with the same reference signs and further, description thereon is omitted in the following.

Figure 19:
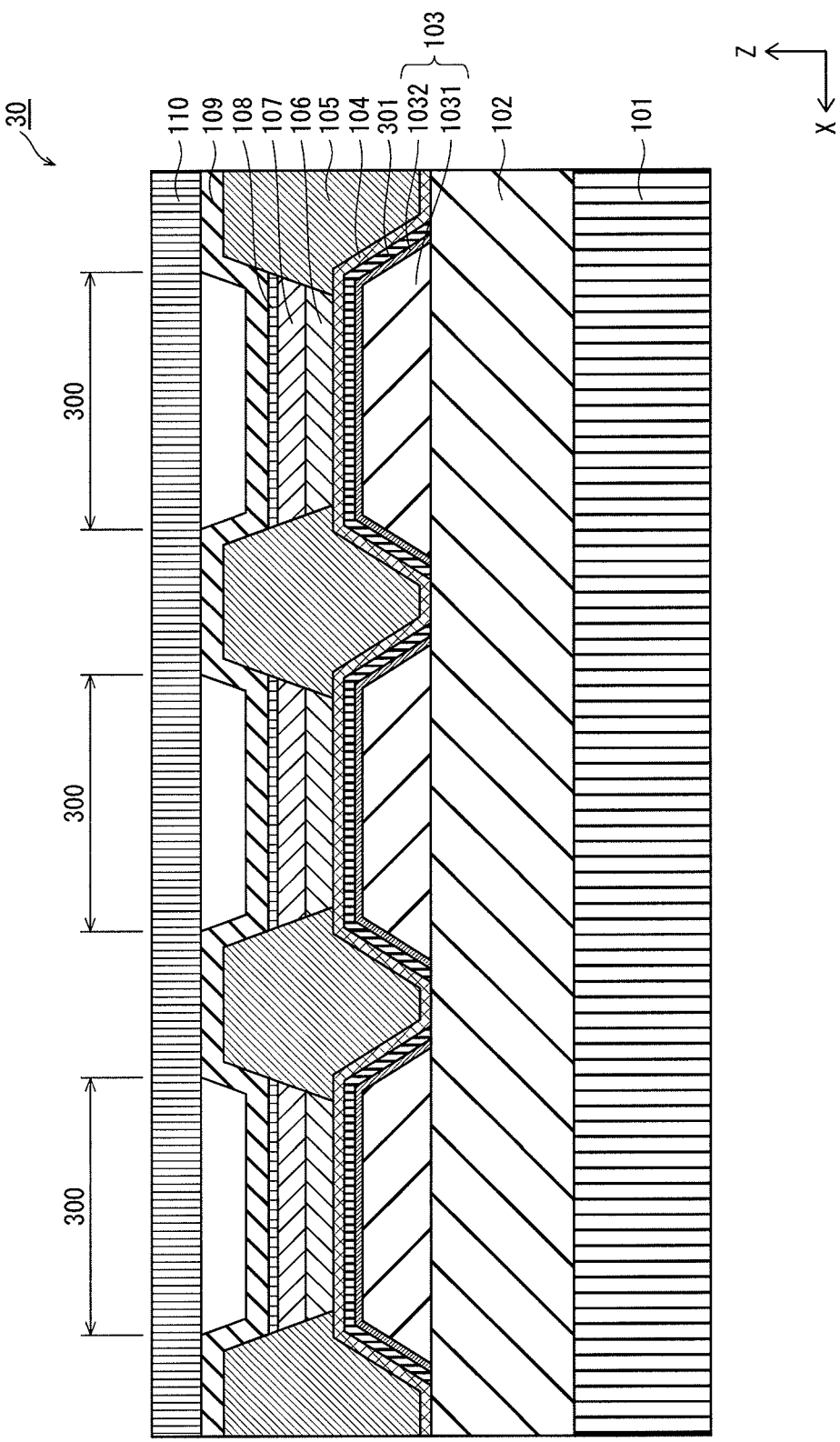
FIG. 19 is a schematic cross-sectional view illustrating a structure of a display panel 30 pertaining to embodiment 2 of the present invention.

As illustrated in FIG. 19, the display panel 30 pertaining to the present embodiment has a structure where a transparent conductive film 301 is interposed between the reflective electrode 103 and the charge injection layer 104. The transparent conductive film 301 is formed by using a similar material as the transparent electrode 109 (i.e., ITO or IZO). In other words, the transparent conductive film 301 is interposed between the reflective electrode 103 and the organic light-emitting layer 107.

Further, as illustrated in FIG. 19, the transparent conductive film 301 is formed for each of pixels 300 of the display panel 30, and therefore, the transparent conductive film 301 for a give one of the pixels 300 is separated from the transparent conductive film 301 for an adjacent one of the pixels 300.

The other elements that are included in the display panel 30 pertaining to embodiment 2 are similar to the corresponding elements included in the display panel 10 pertaining to embodiment 1.

The display panel 30 pertaining to the present embodiment includes the structure of the display panel 10 pertaining to embodiment 1 as-is. Therefore, the above-described effects achieved by the display panel 10 pertaining to embodiment 1 are also achieved, as-is, by the display panel 30 pertaining to the present embodiment. In addition to such effects, since the transparent conductive film 301 is interposed between the reflective electrode 103 and the charge injection layer 104 in the display panel 30 pertaining to the present embodiment, the adjustment of the distance between the organic light-emitting layer 107 and the surface portion of the metal film 1031 included in the reflective electrode 103 can be performed easily by adjusting the film thickness of the transparent conductive film 301. This results in increased flexibility in designing an optical cavity structure, and hence, the display panel 30 pertaining to the present embodiment is provided with excellent light-emitting efficiency.

[Embodiment 3]

Figure 20:
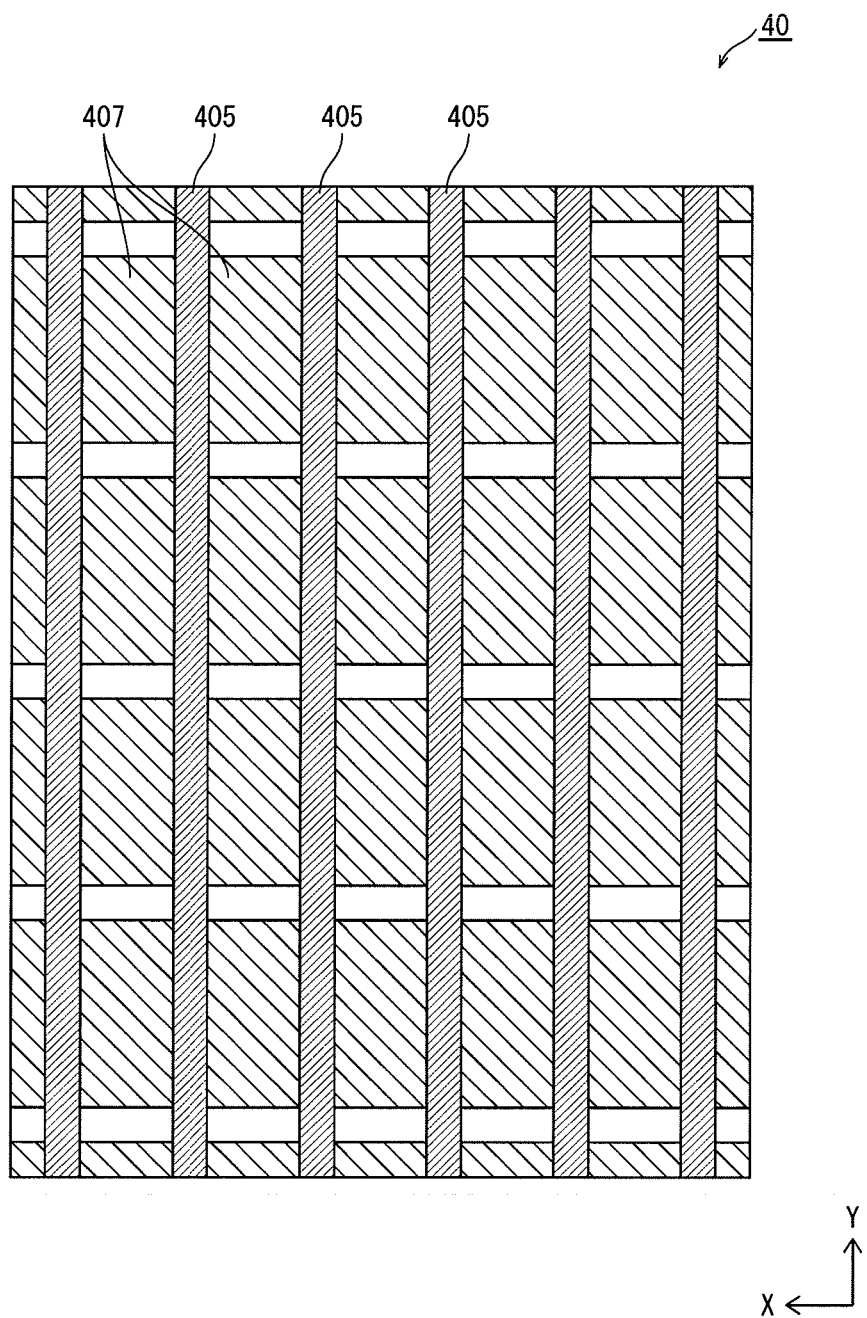
FIG. 20 is a schematic plan view illustrating a structure of banks 405 among elements constituting a display panel 40 pertaining to embodiment 3 of the present invention.

In the following, description is provided on a structure of a display panel 40 pertaining to embodiment 3 of the present invention, with reference to FIG. 20. Note that FIG. 20 is a schematic plan view illustrating the positional relationship between banks 405 and organic light-emitting layers 407, and corresponds to FIG. 3 referred to in embodiment 1. Note that illustration is not provided of elements similar to those included in the display panel 10 pertaining to embodiment 1, and further, description on elements similar to those included in the display panel 10 pertaining to embodiment 1 is omitted in the following.

As illustrated in FIG. 20, the display panel 40 pertaining to the present embodiment includes a plurality of banks 405 each having a shape of a line. The banks 405 are arranged with a predetermined distance between each another. Further, in the X-axis direction in FIG. 20, the banks 405 separate an organic light-emitting element 407 for one pixel from an organic light-emitting element for an adjacent pixel. That is, the banks 405 pertaining to the present embodiment form a so-called line bank structure.

The other elements that are included in the display panel 40 pertaining to embodiment 3 are similar to the corresponding elements included in the display panel 10 pertaining to embodiment 1. In addition, the structure of the display panel 30 pertaining to embodiment 2 is also applicable.

The display panel 40 pertaining to the present embodiment differs from the display panel 10 pertaining to embodiment 1 and the display panel 30 pertaining to embodiment 2 only in that the banks 405 are provided in a different form. As such, the above-described effects achieved by the display panel 10 pertaining to embodiment 1 and the display panel 30 pertaining to embodiment 2 are also achieved, as-is, by the display panel 40 pertaining to the present embodiment.

[Embodiment 4]

Figure 21:
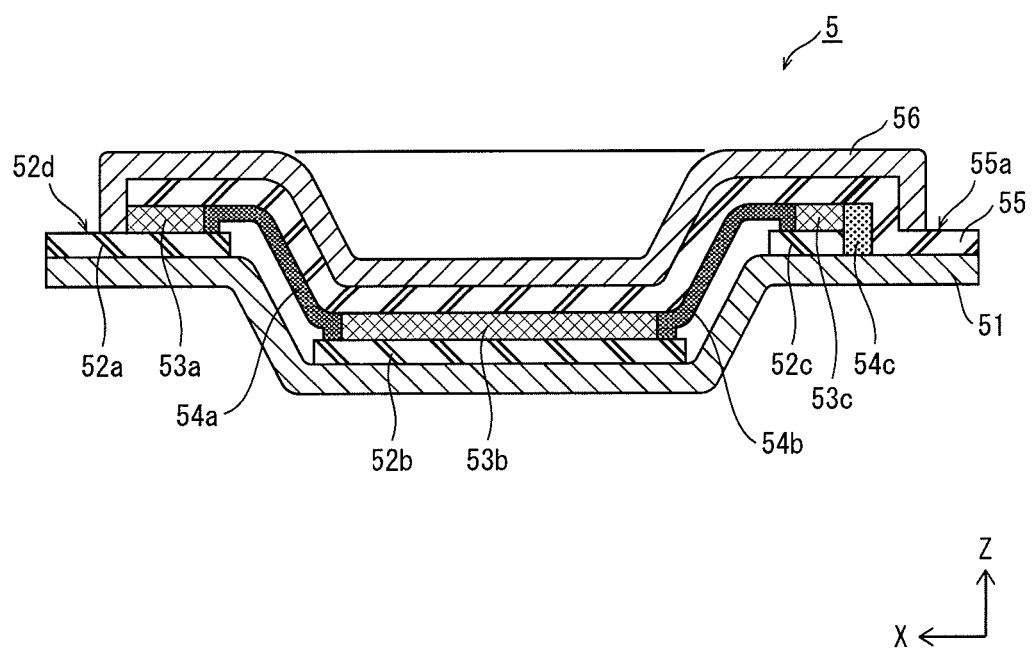
FIG. 21 is a schematic cross-sectional view illustrating a structure of an illumination device 5 pertaining to embodiment 4 of the present invention.

In the following, description is provided on a structure of an illumination device 5 pertaining to embodiment 4 of the present invention, with reference to FIG. 21. FIG. 21 is a schematic cross-sectional view illustrating a structure of the illumination device 5 pertaining to the present embodiment.

As illustrated in FIG. 21, the illumination device 5 includes: a transparent substrate 51; a sealing cover 56; transparent electrodes 52a, 52b, and 52c; a reflective electrode 55; and organic EL laminates 53a, 53b, and 53c. The transparent electrodes 52a, 52b, and 52c, the reflective electrode 55, and the organic EL laminates 53a, 53b, and 53c are accommodated within a space between the transparent substrate 51 and the sealing cover 56, and further, each of the organic EL laminates 53a, 53b, and 53c is sandwiched by a corresponding one of the transparent electrodes 52a, 52b, and 52c and the reflective electrode 55. In addition, the transparent electrodes 52a, 52b, and 52c are electrically connected with one another, and a portion 52d of the transparent electrode 52a extends to the outside from the sealing cover 56.

Further, a portion 55a of the reflective electrode 55 extends to the outside from a side of the sealing cover 56 that is opposite the side from which the portion 52d of the transparent electrode 52a extends outside.

Here, note that each of the organic EL laminates 53a, 53b, and 53c has the same structure as an organic EL laminate interposed between the reflective electrode 103 and the transparent electrode 109 in the display panels 10, 30, and 40 described in embodiments 1 through 4. Further, the organic EL laminates 53a and 53b are connected with an insulator 54a, and the organic EL laminates 53b and 53c are connected with an insulator 54b. The insulators 54a and 54b are insulators having flexibility. In addition, an insulator 54c is provided at a right end of the organic EL laminate 53c in the X-axis direction in FIG. 21.

Here, the reflective electrode 55 in the illumination device 5 pertaining to the present embodiment has the same structure as each of the reflective electrodes 103 included in the display panels 10, 30, and 40 respectively pertaining to embodiments 1, 2, and 3 above. That is, the reflective electrode 55 includes the metal film 1031 and the Ni film 1032 covering the surface of the metal film 1031 without interposition of a metal oxide layer.

According to the illumination device 5 pertaining to the present embodiment, a portion of light emitted from the organic EL laminates 53a, 53b, and 53c is emitted directly towards the lower direction in the Z-axis direction in FIG. 21, and is emitted to the outside by passing through the transparent substrate 51. On the other hand, the rest of the light emitted from the organic EL laminates 53a, 53b, and 53c is emitted towards the upper direction in the Z-axis direction in FIG. 21, is reflected at the reflective electrode 55, is guided towards the lower direction in the Z-axis direction in FIG. 21, and is emitted to the outside by passing through the transparent substrate 51. Since the illumination device 5 pertaining to the present invention is provided with the reflective electrode 55, which has the same structure as each of the reflective electrodes 103 in embodiments 1 through 3, the same effects as described above are achieved.

[Other Matters]

In embodiments 1 through 3, the anode is arranged in the side of the substrate 101 with respect to the organic light-emitting layer 107, and the cathode is arranged in the side from which light is guided out. However, the present invention is not limited to this, and the arrangement of the anode and the cathode with respect to the organic light-emitting layer 107 may be opposite the arrangement described above. When the anode and the cathode are disposed in an opposite arrangement as described above, the cathode is arranged in the side opposite the side from which light is guided out. In such a case, by providing the cathode with the same structure as the reflective electrode 103, the same effects as described above can be achieved.

In addition, the display panels 10, 30, and 40 in embodiments 1 through 3 have the structure of a top-emission type display panel. However, the present invention is not limited to this, and the display panels 10, 30, and 40 may be provided with the structure of a bottom-emission type display panel.

Further, the reflective electrode (i.e., the reflective electrode 103/55) in embodiments 1 through 4 have the structure where the Ni film 1032 is layered on the metal film 1031 (Al film) so as to cover the entire surface of the metal film 1031 (Al film) without interposition of a metal oxide layer (i.e., the metal oxide layer 1035/1037/1039). However, the present invention is not limited to this, and the structure of the reflective electrode is not limited to a structure from which metal oxides are completely eliminated. That is, metal oxide films may be interposed between the metal layer and the Ni layer in the form of discrete islands or in the form of portions of discontinuous film. Here, as description has been provided above, an "oxide layer" is formed over an entirety of a surface of a baselayer. Therefore, the term "oxide layer" refers to a layer covering the entire surface of the baselayer. On the other hand, "oxide films" are formed at portions of a surface of a baselayer. More specifically, "oxide films" refer to films in the form of discrete islands or in the form of portions of a discontinuous film formed on the surface of the baselayer.

In addition, the materials used in embodiments 1 through 4 are mere examples of such materials that can be used. That is, the materials may be altered with other materials as necessary. For instance, the metal film 1031 included in the reflective electrode (i.e., the reflective electrode 103/55) may be formed by using an alloy of Al or the like including Al as a main component, instead of being formed by using pure Al.

[Industrial Applicability]

The present invention is useful in realizing an organic EL element that has longevity at the same times as exhibiting excellent light-emitting characteristics. Further, the present invention is also useful in realizing a display panel and a display device including such an organic EL element.

[Reference Signs List]

1 display device
5 illumination device
10, 30, 40 display panel
20 drive control unit
21-24 drive circuit
25 control circuit
51 transparent substrate
52a, 52b, 52c transparent electrodes
53a, 53b, 53c organic EL laminates
54a, 54b, 54c insulators
55 reflective electrode
56 sealing cover
100, 300 pixels
101 substrate
102 interlayer insulating layer
103 reflective electrode
104 charge injection layer
105, 405 bank
106 charge transport layer
107, 407 organic light-emitting layer
108 electron transport layer
109 transparent electrode
110 upper substrate
301 transparent conductive film
501 resist pattern
502 plating solution
1031, 1036 metal film
1033, 1034 metal layer
1035, 1037 metal oxide layer
1039 metal oxide film
1032, 1038 Ni film

The invention claimed is:

1. An organic EL element, comprising:
a transparent electrode;
a reflective electrode opposite the transparent electrode; and
a light-emitting layer between the transparent electrode and the reflective electrode, the light-emitting layer having a film thickness of 20 nm to 200 nm, wherein
the reflective electrode is a layered film of:
a metal film including Al as a main component, the metal film having a film thickness of at least 43 nm; and
a Ni film layered with respect to the metal film at surfaces thereof including a surface of the metal film facing the light-emitting layer and external side surfaces of the metal film, without interposition of an oxide layer that covers the surfaces of the metal film, a film thickness d of the Ni layer satisfies: 0 nm <d <5 nm, an average roughness Ra of a surface of the layered film facing the light-emitting layer satisfies: 0.6 nm ≤Ra <2.0 nm, a maximum height difference Rmax of the surface of the layered film satisfies: 5 nm ≤Rmax <20 nm, and the external side surfaces of the metal film do not face the light-emitting layer.

2. The organic EL element of claim 1, wherein the maximum height difference Rmax satisfies: 5 nm <Rmax <17 nm.

3. The organic EL element of claim 1, wherein the reflective electrode is provided in plurality, the organic EL element further comprising a bank defining a plurality of apertures each corresponding to one of the reflective electrodes, wherein the light-emitting layer is provided in plurality such that each light-emitting layer is positioned inside a corresponding one of the apertures, and both end portions of each reflective electrode are covered by the bank at least in one cross-sectional direction through the reflective electrode.

4. The organic EL element of claim 1, wherein oxide films are formed on the surface of the metal film facing the light-emitting layer as discrete islands or as portions of a discontinuous film.

5. The organic EL element of claim 1, further comprising a transparent conductive film between the reflective electrode and the light-emitting layer.

6. The organic EL element of claim 5, wherein
the transparent conductive film comprises ITO, IZO, or a metal oxide other than ITO or IZO.

7. The organic EL element of claim 1, further comprising a charge injection layer between the reflective electrode and the light-emitting layer.

8. The organic EL element of claim 7 further comprising a charge transport layer between the charge injection layer and the light-emitting layer.

9. The organic EL element of claim 7, wherein
the charge injection layer is a layer that comprises a metal oxide, a metal nitride, or a metal oxynitride.

10. The organic EL element of claim 7, wherein
the charge injection layer is a layer that comprises tungsten oxide or molybdenum oxide.

11. A display panel comprising the organic EL element of claim 1.

12. The organic EL element of claim 1, wherein
the Ni film is a continuous film covering the surfaces of the metal film including the surface facing the light-emitting layer and the external side surfaces.

13. An organic EL element, comprising:
a transparent electrode;
a reflective electrode opposite the transparent electrode; and
a light-emitting layer between the transparent electrode and the reflective electrode, the light-emitting layer having a film thickness of 20 nm to 200 nm, wherein the reflective electrode is a layered film of:
a metal film including Al as a main component, the metal film having a film thickness of at least 43 nm; and
a Ni film layered with respect to the metal film at surfaces thereof including surface of the metal film facing the light-emitting layer and external side surfaces of the metal film, without interposition of an oxide layer that covers the surfaces of the metal film, a film thickness d of the Ni layer satisfies: 0 nm <d <5 nm, an average roughness Ra of a surface of the layered film facing the light-emitting layer satisfies: 0.6 nm ≤Ra <2.0 nm, a maximum height difference Rmax of the surface of the layered film satisfies: 5 nm ≤Rmax <20 nm, and the Ni film is a film of Ni deposited through electroless plating processing.

14. A display panel having a plurality of pixels, comprising:
a reflective electrode for each of the plurality of pixels;
a bank defining an aperture corresponding to the reflective electrode;
a light-emitting layer positioned inside the aperture; and
a transparent electrode above the light-emitting layer, wherein the bank covers both end portions of the reflective electrode at least in one cross-sectional direction through the reflective electrode, the reflective electrode is a layered film of:
a metal film including Al as a main component, the metal film having a film thickness of at least 43 nm; and
a Ni film layered with respect to the metal film at surfaces thereof including a surface of the metal film facing the light-emitting layer and external side surfaces of the metal film, without interposition of an oxide layer that covers the surfaces of the metal film, a film thickness d of the Ni layer satisfies: 0 nm <d <5 nm, an average roughness Ra of the surface of the metal film satisfies: 0.6 nm ≤Ra <2.0 nm, a maximum height difference Rmax of the surface of the metal film satisfies: 5 nm ≤Rmax <20 nm, and the external side surfaces of the metal film do not face the light-emitting layer.

15. The display panel of claim 14, wherein
the aperture is provided in plurality so as to correspond one-to-one with a plurality of reflective electrodes.

16. The display panel of claim 14, wherein
the plurality of reflective electrodes are arranged so as to form a plurality of lines, and
the aperture is provided in plurality so as to correspond one-to-one with the plurality of lines of the plurality of reflective electrodes.

17. A display device comprising the display panel of claim 14.

18. The display panel of claim 14, wherein
the Ni film is a continuous film covering the surfaces of the metal film including the surface facing the light-emitting layer and the external side surfaces.

* * * * *